US012720693B2

(12) United States Patent
Yun et al.

(10) Patent No.: US 12,720,693 B2
(45) Date of Patent: Aug. 25, 2026

(54) FOLDABLE DISPLAY DEVICE HAVING A HINGE STRUCTURE ALLOWING FOR INNER FOLDING

(71) Applicants: LG DISPLAY CO., LTD., Seoul (KR); Fine M-Tec Co., LTD., Anyang-si (KR)

(72) Inventors: YoungJoon Yun, Goyang-si (KR); Hyunchan Kim, Anseong-si (KR); Jaekyu Lee, Anyang-si (KR); Hyeonggwang An, Incheon (KR); ShinSuk Lee, Gimpo-si (KR)

(73) Assignee: LG Display Co., Ltd. (KR)

( * ) Notice: Subject to any disclaimer, the term of this patent is extended or adjusted under 35 U.S.C. 154(b) by 386 days.

(21) Appl. No.: 17/860,421

(22) Filed: Jul. 8, 2022

(65) Prior Publication Data

US 2023/0021638 A1 Jan. 26, 2023

(30) Foreign Application Priority Data

Jul. 23, 2021 (KR) ........................ 10-2021-0097370

(51) Int. Cl.
*H05K 5/02* (2006.01)
*F16C 11/04* (2006.01)
(Continued)

(52) U.S. Cl.
CPC ............ *H05K 5/0226* (2013.01); *F16C 11/04* (2013.01); *H05K 5/0018* (2022.08); *E05D 3/122* (2013.01);
(Continued)

(58) Field of Classification Search
CPC .. H05K 5/0226; E05Y 2201/638; E05D 3/122
See application file for complete search history.

(56) References Cited

U.S. PATENT DOCUMENTS 10,037,058 B2 * 7/2018 Kato ..................... G06F 1/1681
10,054,990 B1 * 8/2018 Harmon ................ G06F 1/1652
(Continued)

FOREIGN PATENT DOCUMENTS

CN 209358590 U 9/2019
CN 211423150 U 9/2020
(Continued)

OTHER PUBLICATIONS

Office Action in Chinese Appln. No. 2022107411447, mailed on Jun. 9, 2025, 14 pages (with English translation).

*Primary Examiner* — Rockshana D Chowdhury
*Assistant Examiner* — Douglas R Burtner
(74) *Attorney, Agent, or Firm* — Fish & Richardson P.C.

(57) ABSTRACT

A foldable display device includes a first support plate and a second support plate, a display panel disposed on the first support plate and the second support plate and a hinge assembly disposed between the first support plate and the second support plate, wherein the hinge assembly includes, a first hinge arm and a second hinge arm rotatably connected to each other, a first virtual axis gear coupled to the first hinge arm, a second virtual axis gear coupled to the second hinge arm, a first rotational gear and a second rotational gear disposed to mesh with each other between the first virtual axis gear and the second virtual axis gear and a first gear arm and a second gear arm fastened to interlock with the first virtual axis gear and the second virtual axis gear, wherein the first support plate, the second support plate, and the display panel perform folding and unfolding operations about a rotation axis different from central axes of the first virtual axis gear and the second virtual axis gear.

19 Claims, 23 Drawing Sheets

(51) Int. Cl.

| | |
|---|---|
| ***H05K 5/00*** | (2006.01) |
| *E05D 3/12* | (2006.01) |
| *E05D 11/00* | (2006.01) |
| *E05D 11/08* | (2006.01) |

(52) U.S. Cl.

CPC ........ *E05D 11/0054* (2013.01); *E05D 11/081* (2013.01); *E05Y 2201/11* (2013.01); *E05Y 2201/218* (2013.01); *E05Y 2201/474* (2013.01); *E05Y 2201/48* (2013.01); *E05Y 2201/638* (2013.01); *E05Y 2999/00* (2024.05)

(56) References Cited

U.S. PATENT DOCUMENTS 10,394,062 B1 * 8/2019 Song ................. G02F 1/133308
10,423,019 B1 * 9/2019 Song ..................... G06F 1/1652
10,480,225 B1 * 11/2019 Hsu ....................... G06F 1/1616
10,545,541 B1 * 1/2020 Dighde ..................... E05D 3/18
10,564,682 B1 * 2/2020 Wu ....................... G06F 1/1652
10,845,850 B1 * 11/2020 Kang .................... G06F 1/1616
11,625,073 B2 * 4/2023 Shim ..................... G06F 1/1681 361/679.28
11,662,781 B2 * 5/2023 Kang ...................... E05D 3/122 361/679.01
11,726,530 B2 * 8/2023 Kang .................... G06F 1/1681 361/679.27
11,940,839 B2 * 3/2024 Cho ........................ F16C 11/04
12,108,550 B2 * 10/2024 Oh ........................ H04M 1/022
12,216,508 B2 * 2/2025 Hwang ................. G06F 1/1681
12,510,938 B2 * 12/2025 Hong .................... G06F 1/1652
12,591,277 B2 * 3/2026 Hong .................... G06F 1/1681
12,601,371 B2 * 4/2026 Kim ........................ F16C 11/04
2015/0257289 A1 * 9/2015 Lee ....................... G06F 1/1652 361/749
2018/0324964 A1 * 11/2018 Yoo .......................... H05K 5/03
2019/0112852 A1 * 4/2019 Hsu ....................... G06F 1/1618
2019/0132975 A1 * 5/2019 Kim ...................... E05D 11/082
2019/0200470 A1 * 6/2019 Woo ........................ E05D 11/10
2020/0348732 A1 * 11/2020 Kang .................... G06F 1/1652
2020/0375046 A1 * 11/2020 Sim ...................... H05K 5/0017
2021/0011513 A1 1/2021 Watamura et al.
2021/0026407 A1 1/2021 Park et al.
2021/0116975 A1 4/2021 Moon
2022/0206544 A1 * 6/2022 Park ...................... G06F 1/1616
2022/0217859 A1 * 7/2022 Lee ...................... G06F 1/1652
2022/0264756 A1 * 8/2022 Oh ........................ H04M 1/022
2023/0007797 A1 * 1/2023 Jiang ..................... G06F 1/1681
2023/0044949 A1 * 2/2023 Park ...................... F16C 11/045
2023/0136116 A1 * 5/2023 Kim ........................ F16C 11/10 361/807
2023/0259178 A1 * 8/2023 An ........................ G06F 1/1643 361/679.27
2023/0384822 A1 * 11/2023 Lee ....................... G06F 1/1618
2024/0032226 A1 * 1/2024 Jiang ..................... G06F 1/1652
2024/0074075 A1 * 2/2024 Kim ...................... G06F 1/1616
2025/0004508 A1 * 1/2025 Park ...................... H04M 1/022
2025/0048572 A1 * 2/2025 Shi .......................... F16C 11/04
2025/0374456 A1 * 12/2025 Yang ..................... H04M 1/022

FOREIGN PATENT DOCUMENTS

| | | | |
|---|---|---|---|
| CN | 112289176 | A | 1/2021 |
| CN | 112770554 | A | 5/2021 |
| JP | 2021-15522 | A | 2/2021 |
| KR | 10-2019-0079033 | A | 7/2019 |
| KR | 10-2020-0126524 | A | 11/2020 |
| KR | 10-2020-0135636 | A | 12/2020 |
| KR | 10-2020-0137896 | A | 12/2020 |
| KR | 10-2021-0068880 | A | 6/2021 |
| WO | 2020/171481 | A1 | 8/2020 |

* cited by examiner

FOLDABLE DISPLAY DEVICE HAVING A HINGE STRUCTURE ALLOWING FOR INNER FOLDING

CROSS-REFERENCE TO RELATED APPLICATION

This application claims the priority of Korean Patent Application No. 10-2021-0097370 filed on Jul. 23, 2021, which is hereby incorporated by reference in its entirety.

BACKGROUND

Field of the Disclosure

The present disclosure relates to a foldable display device, and more particularly, to a foldable display device having a hinge structure allowing for inner folding.

Description of the Background

Recently, portable terminals such as wireless terminals, personal digital assistants (PDAs), portable multimedia players (PMPs), and electronic organizers are being reduced in size for portability. However, since users want to receive various kinds of information such as text information, videos, still images, MP3, and games through a screen of the portable terminal, they require enlargement and widening of a size of a screen of a display unit. However, since the reduction in size of the portable terminal leads to a reduction in the size of the display screen, there is a limit in satisfying both requirements.

As a way to overcome this limitation, a flexible display device such as a bendable display device or a foldable display device has recently been developed.

The flexible display device may be implemented by forming a substrate of a plastic material. Since the flexible display device can be easily carried when folded and can realize a large screen when unfolded, it can be applied to various fields such as the fields of televisions and monitors, as well as mobile devices such as mobile phones, e-books, and electronic newspapers.

The flexible display device may have a structure in which a mechanism including a hinge is used in an area where a display panel is folded to implement a foldable display device among flexible display devices. However, when implementing a folding hinge using only a 4-axis gear, it is difficult to manufacture a set having a small thickness, or in order to implement a small thickness, a gear size gets small and durability may be defective.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a foldable display device that substantially obviates one or more of problems due to limitations and disadvantages described above.

More specifically, the present disclosure is to provide a foldable display device having a new hinge structure that forms a folding trajectory based on a 2-axis rotation structure.

The present disclosure is also to provide a foldable display device with a new hinge structure having a 4-axis gear and a link slider structure for sync between axes during 2-axis rotation.

The present disclosure is also to provide a foldable display device having a hinge structure allowing for inner folding, capable of securing durability without an increase in thickness of the foldable display device.

In addition, it has been realized in the present disclosure that holding force using friction between components constitutes the hinge to maintain a specific folding angle of the foldable display device during folding and unfolding operations of the foldable display device. However, it have been recognized in the present disclosure that the holding force for maintaining a specific folding angle of the foldable display device is reduced due to continuous folding and unfolding operations of the foldable display device. Further, it have been recognized in the present disclosure that, unlike a folder phone, a foldable display device is heavy and thus requires high holding force.

Accordingly, the present disclosure is to provide a new structure of a foldable display device capable of maintaining a specific folding angle of the foldable display device by implementing a holding torque and a free stop function by applying a cam structure including compression springs.

In addition, the present disclosure is to provide a foldable display device having a new structure in which holding torque can be strengthened by assisting the free stop function through applying leaf springs.

Accordingly, the present disclosure is to provide a new structure of a foldable display device, in which holding force does not decrease even when the foldable display device is continuously used, the holding force can be permanently implemented, and high holding force can be implemented even when the foldable display device is heavy.

The present disclosure is also to provide a foldable display device to which shutter frames for supporting and bending a foldable panel.

The present disclosure is also to provide a foldable display device to which a dust discharge structure capable of improving operation failure due to dust generated due to friction between components constituting the hinge is applied.

The present disclosure is not limited to the above-mentioned features, which are not mentioned above, can be clearly understood by those skilled in the art from the following descriptions.

To achieve these and other advantages and in accordance with the present disclosure, as embodied and broadly described, a foldable display device includes a first support plate and a second support plate, a display panel disposed on the first support plate and the second support plate and a hinge assembly disposed between the first support plate and the second support plate, wherein the hinge assembly includes a first hinge arm and a second hinge arm rotatably connected to each other, a first virtual axis gear coupled to the first hinge arm, a second virtual axis gear coupled to the second hinge arm, a first rotational gear and a second rotational gear disposed to mesh with each other between the first virtual axis gear and the second virtual axis gear and a first gear arm and a second gear arm fastened to interlock with the first virtual axis gear and the second virtual axis gear, wherein the first support plate, the second support plate, and the display panel perform folding and unfolding operations about a rotation axis different from central axes of the first virtual axis gear and the second virtual axis gear.

Other detailed matters of the exemplary aspects are included in the detailed description and the drawings.

According to the present disclosure, durability can be secured without increasing a thickness of a foldable display device.

According to the present disclosure, holding force for maintaining a specific folding angle of a foldable display device can be implemented.

According to the present disclosure, price competitiveness of a foldable display device can be improved by minimizing parts and simplifying a structure while improving durability of a foldable display device.

According to the present disclosure, operation failure of a foldable display device due to dust can be improved.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
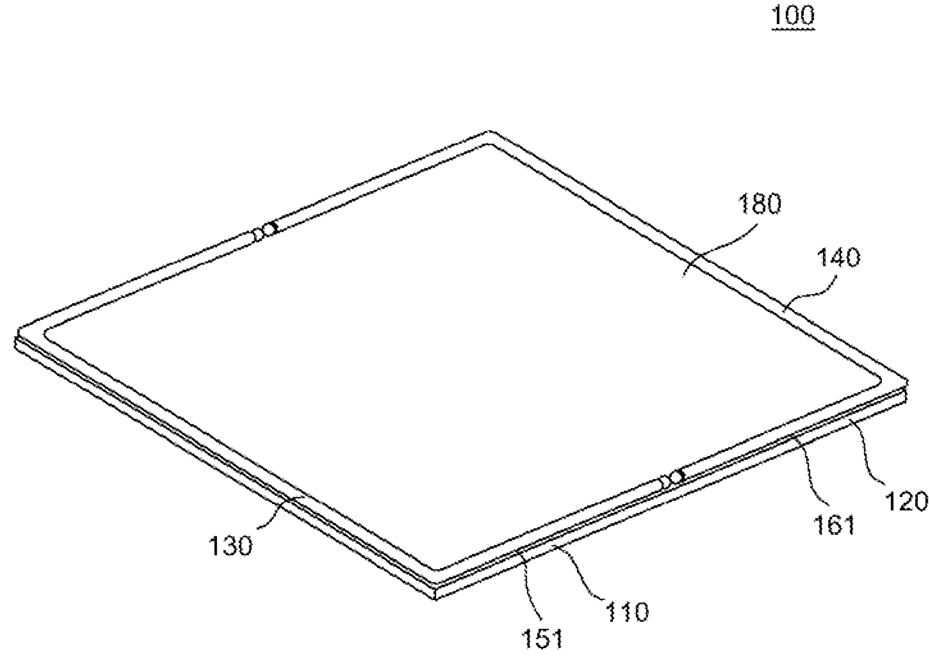
FIG. 1 is a perspective view of a foldable display device according to a first aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, another layer or another element may be interposed directly on the other element or therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to the accompanying drawings.

FIG. 1 is a perspective view of a foldable display device according to a first exemplary aspect of the present disclosure.

Figure 2:
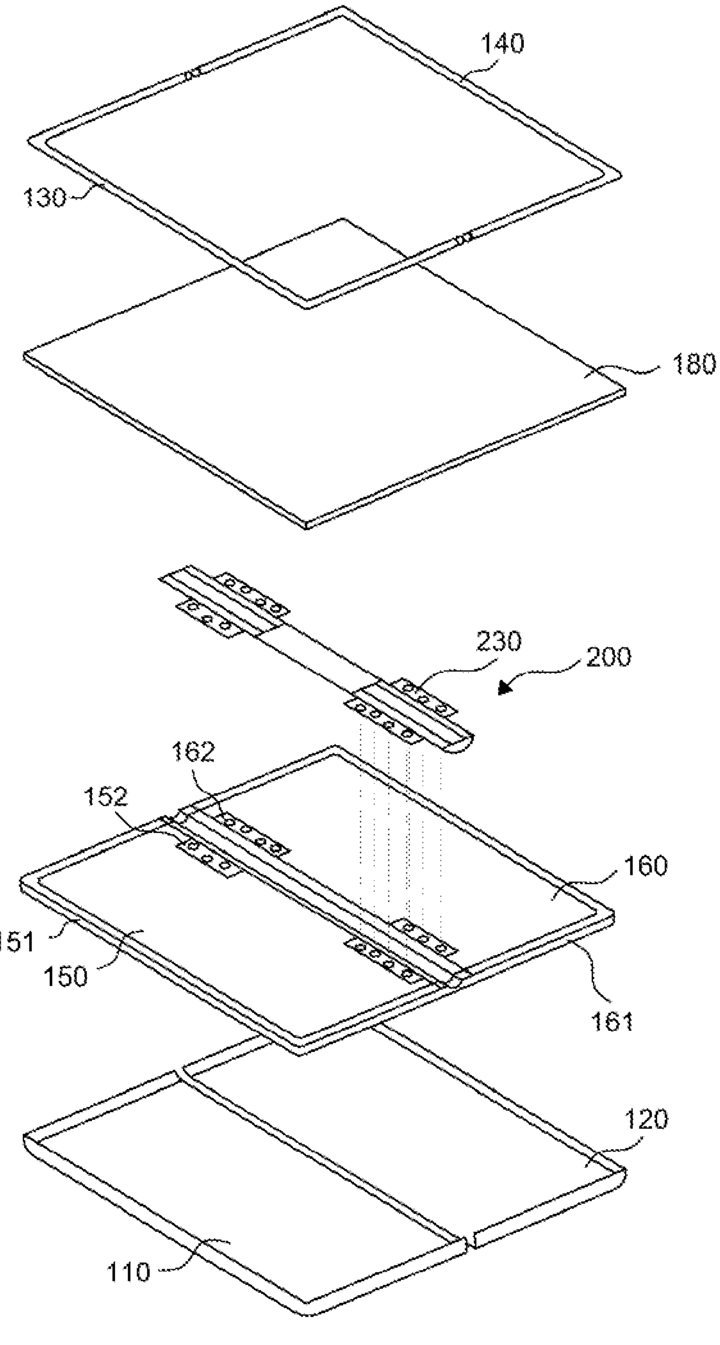
FIG. 2 is a schematic exploded perspective view of the foldable display device according to the first aspect of the present disclosure.

FIG. 2 is a schematic exploded perspective view of the foldable display device according to the first exemplary aspect of the present disclosure.

Figure 3:
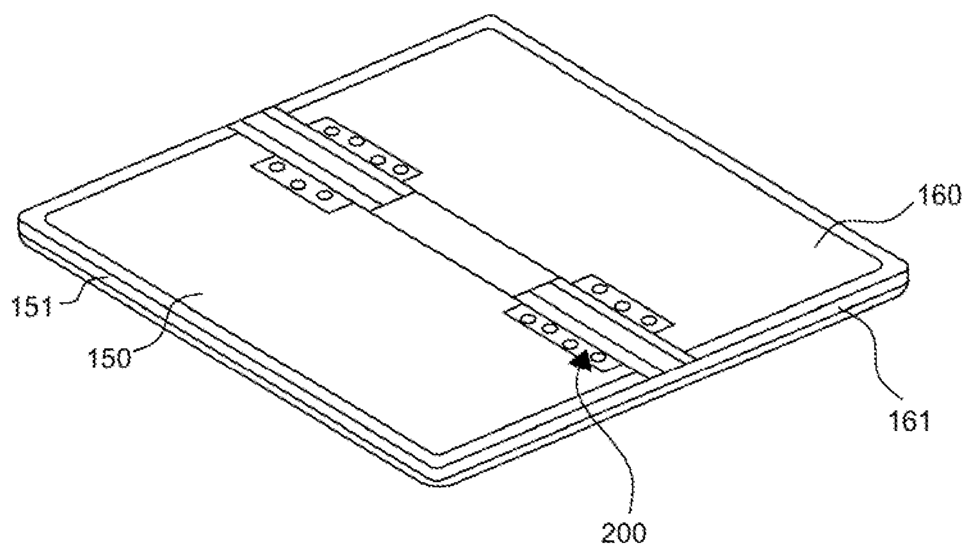
FIG. 3 is a perspective view illustrating a part of a configuration of the foldable display device according to the first aspect of the present disclosure.

FIG. 3 is a perspective view illustrating a part of a configuration of the foldable display device according to the first exemplary aspect of the present disclosure.

FIG. 3 illustrates components of a foldable display device 100 according to the first exemplary aspect of FIG. 1 except for a display panel 180 and bezel covers 130 and 140.

Referring to FIGS. 1 to 3, the foldable display device 100 according to the first exemplary aspect of the present disclosure may be configured to include set housings 110 and 120, set frames 150, 151, 160 and 161, a hinge assembly 200, the display panel 180, and the bezel covers 130 and 140.

In FIG. 1, components of the foldable display device 100 are briefly illustrated for convenience of explanation, but various components for driving the foldable display device 100 may be further included.

The set housings 110 and 120 may be disposed under the display panel 180, the hinge assembly 200, and the set frames 150, 151, 160, and 161.

The set housings 110 and 120 are a set of exterior covers, and may include a first cover 110 on a left and a second cover 120 on a right, but the present disclosure is not limited thereto.

The first cover 110 and the second cover 120 may be disposed in one area and the other area in which the foldable display device 100 according to the first exemplary aspect of the present disclosure is folded and unfolded. That is, in the foldable display device 100 according to the first exemplary aspect of the present disclosure, folding and unfolding operations are performed based on a boundary area between the first cover 110 and the second cover 120 by external force that is applied by a user.

The first cover 110 and the second cover 120 may be provided to have the same shape.

The set frames 150, 151, 160, and 161 are a set of built-in frames, on which various hardware components of the foldable display device 100 may be mounted and the display panel 180 may be seated.

To this end, the set frames 150, 151, 160, 161 may include a first support plate 150 on the left and a second support plate 160 on the right, and a first frame 151 on the left and a second frame 161 on the right, but the present disclosure is not limited thereto.

The first support plate 150 and the second support plate 160 may be separately provided to be folded independently of each other, and the hinge assembly 200 may be provided therebetween.

The first frame 151 and the second frame 161 may be separately provided to be folded independently of each other.

The first frame 151 and the second frame 161 may surround and fix edges of the first bezel cover 130 and the first support plate 150 and edges of the second bezel cover 140 and the second support plate 160, respectively.

In this case, the first support plate 150 and the second support plate 160 may include a first fastening unit 152 and a second fastening unit 162 that are coupled to the hinge assembly 200, respectively.

The first support plate 150 and the second support plate 160 may be provided to have the same shape, and the first fastening unit 152 and the second fastening unit 162 may be disposed to face each other and be symmetrical.

Although not shown in detail, a plurality of fastening grooves are formed in the first fastening unit 152 and the second fastening unit 162, and a plurality of fastening grooves are formed in one surfaces of facing hinge arms 230 of the hinge assembly 200, so that the hinge assembly 200 is fixed thereto.

An insertion groove may be formed in a folded portion between the first support plate 150 and the second support plate 160, and a hinge housing of the hinge assembly 200 may be inserted into the insertion groove.

The foldable display device 100 according to the first exemplary aspect of the present disclosure may be implemented in an inner folding manner in which a screen unit is disposed internally, when folded. However, the present disclosure is not limited thereto.

Meanwhile, the first support plate 150 and the second support plate 160 may be base members for supporting various components of the foldable display device 100 by including the display panel 180. Also, the first support plate 150 and the second support plate 160 may accommodate various components for driving the foldable display device 100.

The first support plate 150 and the second support plate 160 according to the first exemplary aspect of the present disclosure may be disposed in one area and the other area where the foldable display device 100 is folded and unfolded. That is, the foldable display device 100 may be folded and unfolded based on a boundary area between the first support plate 150 and the second support plate 160 by an external force that is applied by a user.

The hinge arm 230 may connect the first fastening unit 152 of the first support plate 150 and the second fastening unit 162 of the second support plate 160. In this case, one or more hinge arms 230 of the hinge assembly 200 may be provided. In FIG. 2, it is illustrated that the hinge arms 230 are provided one by one at one side and the other side of the hinge assembly 200, but the present disclosure is not limited thereto.

Specifically, a pair of hinge arms 230 may respectively connect one sides and the other sides of the first fastening unit 152 and the second fastening unit 162.

As described above, the hinge assembly 200 may be disposed at a portion of the foldable display device 100 where the foldable display device 100 is folded and unfolded, so that folding and unfolding operations of the foldable display device 100 may be facilitated. Also, the hinge assembly 200 may provide a predetermined holding force to maintain the foldable display device 100 in a folded state at a specific angle. In this case, the holding force of the hinge assembly 200 may be provided from a cam structure including compression springs. A detailed structure and function of the hinge assembly 200 will be described later with reference to FIGS. 4 to 11.

The display panel 180 may be disposed on one surface of the first support plate 150 and the second support plate 160.

As the display panel 180, one of various display panels such as an organic light emitting display panel or a liquid crystal display panel may be used.

Although not shown in the drawings, the display panel 180 is a component to display an image to a user and may include a plurality of sub-pixels. In the display panel 180, a plurality of scan lines and a plurality of data lines cross each other, and each of the plurality of sub-pixels may be connected to the scan lines and data lines. In addition, each of the plurality of sub-pixels may be connected to a high potential power line, a low potential power line, an initialization signal line, an emission control signal line, and the like.

The sub-pixels are minimum units constituting a screen, and each of the plurality of sub-pixels may include a light emitting element and a pixel circuit for driving the light emitting element. A plurality of light emitting elements may be defined differently depending on a type of the display panel 180. For example, when the display panel 180 is an organic light emitting display panel, the light emitting element may be an organic light emitting element including an anode, a light emitting unit, and a cathode. Hereinafter, descriptions are made on the assumption that the light emitting element is an organic light emitting element, but a type of the light emitting element is not limited thereto.

The pixel circuit is a circuit for controlling a driving of the light emitting element. The pixel circuit may include, for example, a plurality of transistors and a capacitor, but is not limited thereto.

Also, the display panel 180 may have flexibility so that it can be folded and unfolded along with the folding and unfolding of the foldable display device 100.

The foldable display device 100 may be folded such that the first support plate 150 and the second support plate 160 form a specific folding angle. That is, in FIGS. 1 and 2, it is illustrated that the first support plate 150 and the second support plate 160 are fully unfolded to have an angle of, for example, 180°, but the foldable display device 100 may be folded at a specific angle. In this case, the display panel 180 disposed on the first support plate 150 and the second support plate 160 may also be folded at a specific angle along with folding of the first support plate 150 and the second support plate 160.

Also, the foldable display device 100 may maintain a specific folding angle by the holding force provided from the hinge assembly 200. That is, the first support plate 150 and the second support plate 160 may be fixed by the hinge assembly 200 while maintaining a specific folding angle. Accordingly, the foldable display device 100 may be folded at a specific angle according to a user's intention, and may maintain a folded state at a specific angle by the holding force of the hinge.

The bezel covers 130 and 140 may cover an upper bezel of the display panel 180 on an upper surface of the display panel 180.

The bezel covers 130 and 140 may include a first bezel cover 130 on the left and a second bezel cover 140 on the right, but the present disclosure is not limited thereto.

Hereinafter, a specific structure and function of the hinge assembly 200 will be described in detail with reference to FIGS. 4 to 11.

Figure 4:
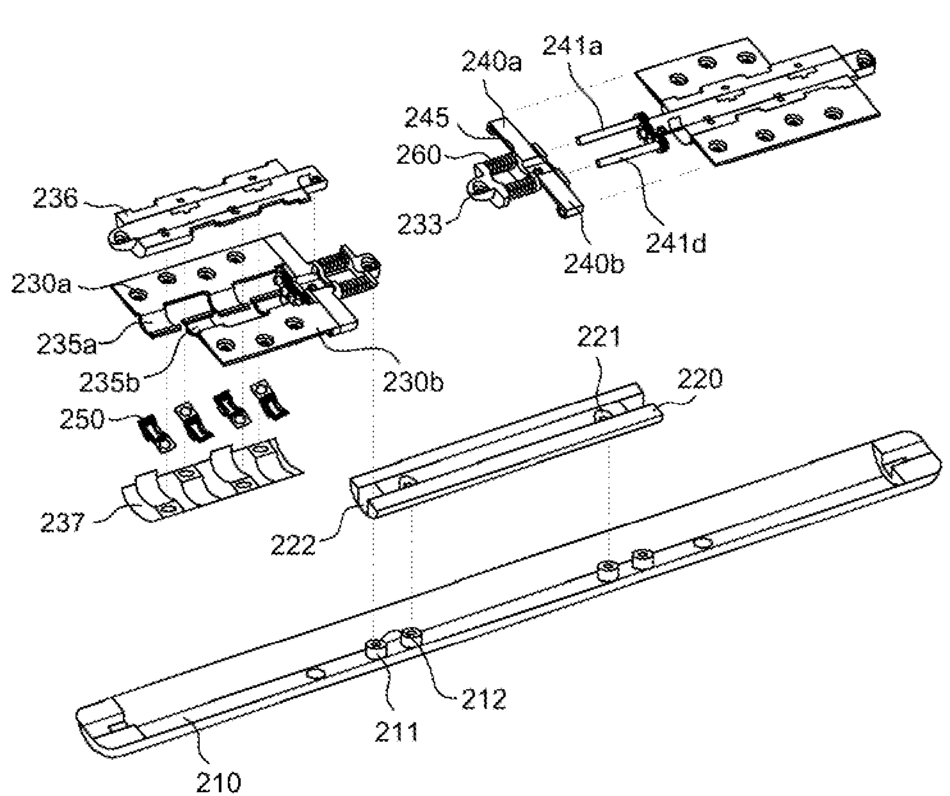
FIG. 4 is an exploded perspective view of a hinge assembly according to the first aspect of the present disclosure.

FIG. 4 is an exploded perspective view of a hinge assembly according to the first exemplary aspect of the present disclosure.

Figure 5A:
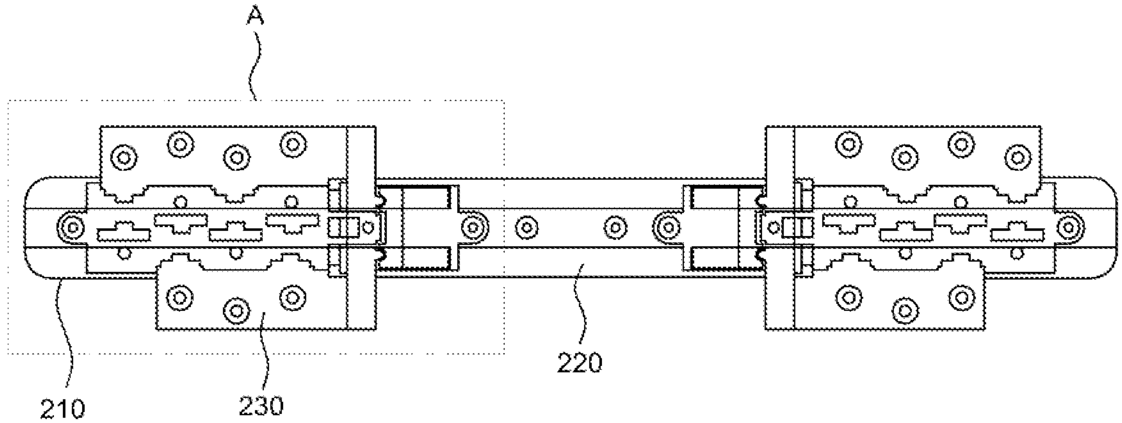
FIG. 5A is a perspective view of the hinge assembly according to the first aspect of the present disclosure.
Figure 5B:
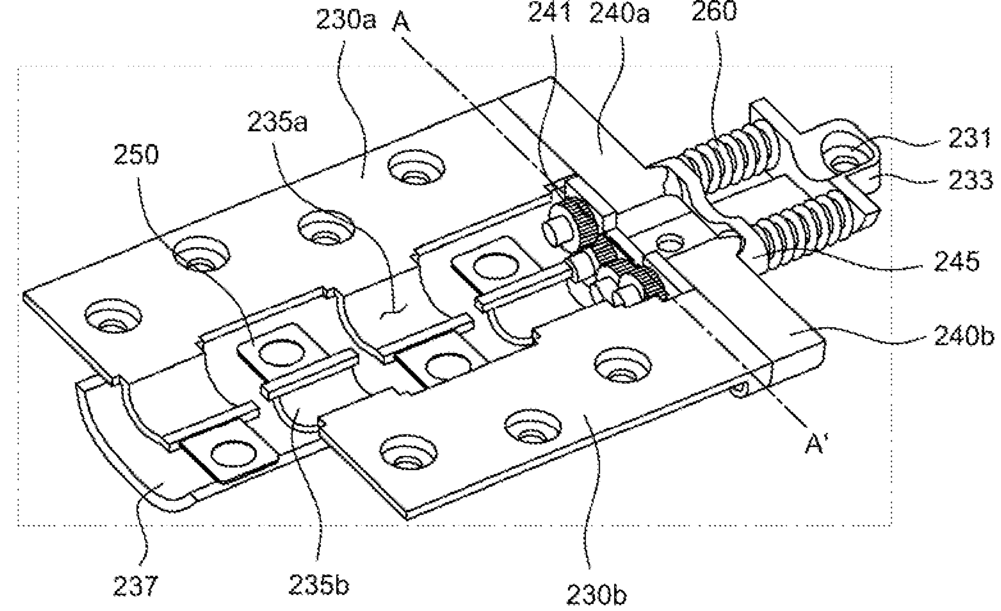
FIG. 5B is an enlarged view of part A of FIG. 5A.

FIG. 5A is a perspective view of the hinge assembly according to the first exemplary aspect of the present disclosure;

FIG. 5B is an enlarged view of part A of FIG. 5A.

Figure 6A:
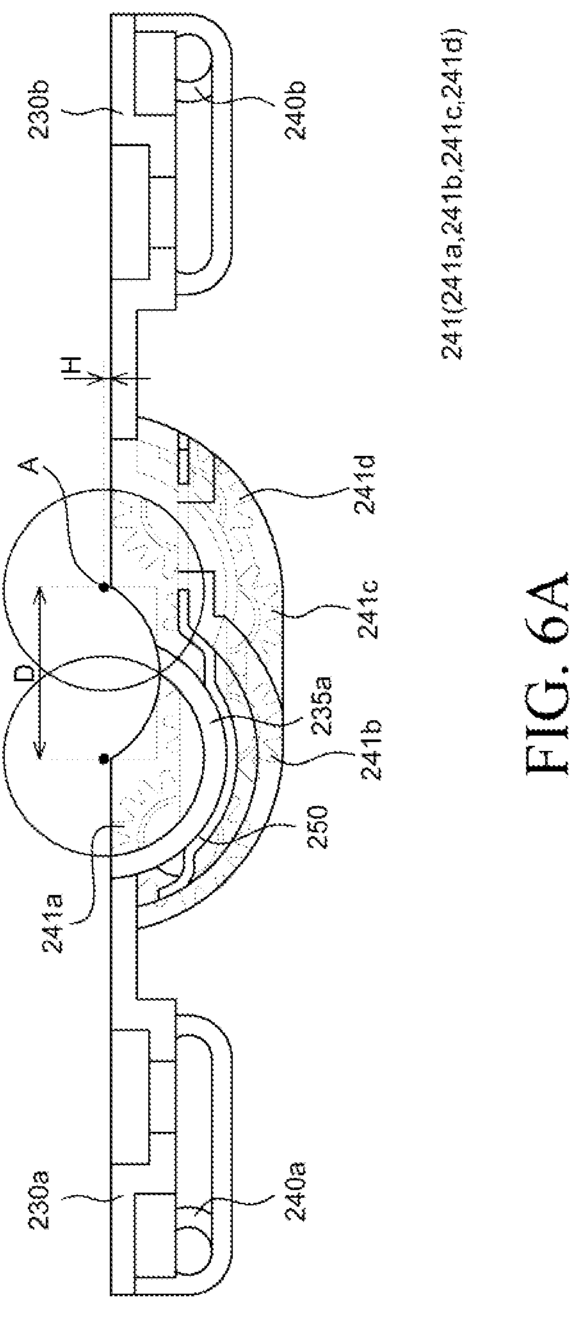
FIG. 6A is a side view of the hinge assembly of FIG. 5B.

FIG. 6A is a side view of the hinge assembly of FIG. 5B.

Figure 6B:
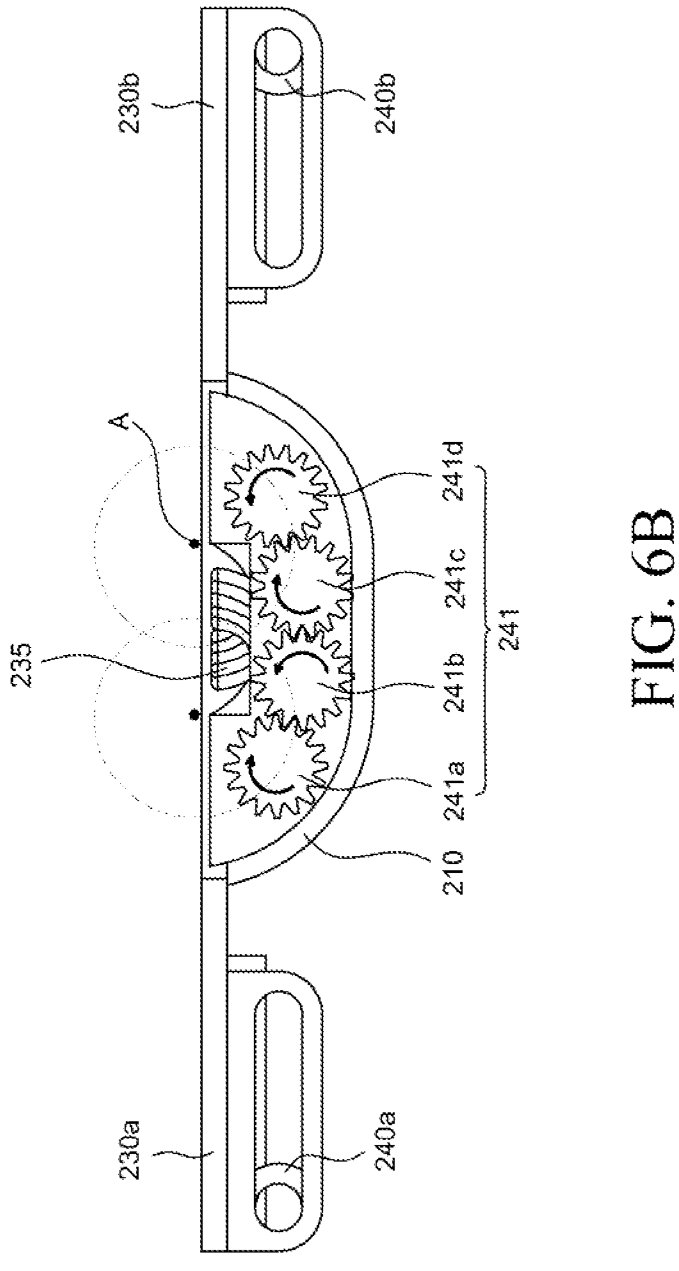
FIG. 6B is a cross-sectional view taken along line A-A' of FIG. 5B.

FIG. 6B is a cross-sectional view taken along line A-A' of FIG. 5B.

Referring to FIG. 4 to FIGS. 6A and 6B, the hinge assembly 200 according to the first exemplary aspect of the present disclosure may be largely configured to include a hinge housing 210, a hinge arm 230, and an inner frame 220.

In addition, the hinge assembly 200 according to the first exemplary aspect of the present disclosure may further include an upper hinge arm cover 236 and a lower hinge arm cover 237 that are fastened at an upper portion and a lower portion of the hinge arm 230. In this case, the upper hinge arm cover 236 and the lower hinge arm cover 237 may serve to guide the hinge arm 230 in the upper and lower portions.

The hinge assembly 200 includes a pair of hinge arms 230 on respective both sides thereof, and the hinge arms 230 may be rotatably connected to each other. That is, the hinge arm 230 may include a first hinge arm 230*a* and a second hinge arm 230*b* having a symmetrical structure. However, the present disclosure is not limited thereto.

The first hinge arm 230*a* and the second hinge arm 230*b* may have a structure symmetrical to each other.

The hinge arm 230 according to the first exemplary aspect of the present disclosure is characterized by having a 2-axis folding (rotational) structure. That is, when implementing a folding hinge using a 4-axis gear, it is infeasible to manufacture a set having a small thickness, or in order to implement a small thickness, a gear size gets small and durability may be defective. Accordingly, the present disclosure is characterized by a new hinge structure of the foldable display device 100, that forms a folding trajectory (or folding path, folding track) (denoted by a dotted line in FIG. 6A) based on a 2-axis rotation structure. That is, the present disclosure is characterized by the foldable display device 100 having a 2-axis folding hinge structure that can be folded in an inner direction in a foldable product. In addition, the present disclosure is characterized by a new hinge structure of the foldable display device 100 having a 4-axis sync gear 241 and a link slider structure for sync between axes during 2-axis rotation.

The sync gear 241 may be a gear for sync of the hinge arm 230 of 2-axis folding.

The sync gear 241 may include a first virtual axis gear 241*a* coupled to the first hinge arm 230*a* and a second virtual axis gear 241*d* coupled to the second hinge arm 230*b*.

The first virtual axis gear 241*a* and the second virtual axis gear 241*d* may have a virtual axis different from a rotation axis A which is an actual axis.

A first tooth portion and a second tooth portion respectively formed in the first virtual axis gear 241*a* and the second virtual axis gear 241*d* may be formed only in a portion of a circumference.

The first tooth portion and the second tooth portion of the first virtual axis gear 241*a* and the second virtual axis gear 241*d* may be formed at least 90 degrees, and may be formed at degrees equal to or greater than 90 degrees and equal to or less than 180 degrees. However, the present disclosure is not limited thereto.

The first virtual axis gear 241*a* and the second virtual axis gear 241*d* may be spaced apart from each other without meshing with each other. Accordingly, the first virtual axis gear 241*a* and the second virtual axis gear 241*d* may mesh with a first rotation gear 241*b* and a second rotation gear 241*c*, respectively. That is, the sync gear 241 may further include the first rotation gear 241*b* and the second rotation gear 241*c*.

The four sync gears 241 of the present disclosure, that is, the first virtual axis gear 241*a* and the second virtual axis gear 241*d*, and the first rotation gear 241*b* and the second rotation gear 241*c* may maintain left and right synchronization.

One side of the first virtual axis gear 241*a* and one side of the second virtual axis gear 241*d* may be respectively, rotatably fastened to a cam frame 233, and the other side of the first virtual axis gear 241*a* and the other side of the second virtual axis gear 241*d* may be rotatably fastened to the first hinge arm 230*a* and the second hinge arm 230*b*, respectively, via a gear arm 240.

That is, the gear arm 240 includes a first gear arm 240*a* and a second gear arm 240*b*, and the first virtual axis gear 241*a* and the second virtual axis gear 241*d* may be fastened to the first gear arm 240*a* and the second gear arm 240*b*, respectively, to interlock (or to be linked) therewith.

The gear arm 240 may be a link configuration for connecting the first virtual axis gear 241*a* and the second virtual axis gear 241*d* and the 2-axis hinge arm 230. That is, the first gear arm 240*a* and the second gear arm 240*b* may be connected to the first hinge arm 230*a* and the second hinge arm 230*b*, respectively. Accordingly, during a folding operation or an unfolding operation of the foldable display device 100, a plurality of first rotation units 235*a* and a plurality of second rotation units 235*b*, and the first hinge arm 230*a* and the second hinge arm 230*b* may rotate together according to rotation of the first gear arm 240*a* and the second gear arm 240*b*.

In this manner, the first hinge arm 230*a* and the second hinge arm 230*b* may interlock with the first gear arm 240*a* and the second gear arm 240*b*, respectively.

The cam frame 233 may constitute a frame for seating and assembling of a cam 245.

Compression springs 260 for implementing frictional force of the cam 245 may be provided between the gear arm 240 and the cam frame 233.

The compression springs 260 may be provided on outer surfaces of the first virtual axis gear 241*a* and the second virtual axis gear 241*d* between the gear arm 240 and the cam frame 233.

The cam 245 for maintaining folding and unfolding angles of the hinge arm 230 may be provided between the compression springs 260 and the gear arm 240. That is, the cam 245 may be a component for torque of folding and unfolding of the hinge arm 230.

Meanwhile, a predetermined hinge housing 210 that accommodates the hinge arm 230 may be provided in a lower portion of the hinge assembly 200.

The hinge housing 210 is an exterior cover of the hinge assembly 200, has a predetermined length and may have a space therein so that the hinge arm 230 and the inner frame 220 are accommodated in the space.

The inner frame 220 may be a frame for fixing an inside of the hinge assembly 200. A plurality of fastening holes 221 and a through groove 222 may be provided in the inner frame 220.

In addition, fixing members 211 that face the fastening holes 221 of the inner frame 220 are formed in the hinge housing 210, and fixing grooves (or fixing holes) 212 are formed in the fixing members 211, so that the fixing members 211 may be fastened and fixed to the fastening holes 221 through fastening members such as screws.

The hinge housing 210 may have a predetermined size, and thus the hinge arm 230, the upper hinge arm cover 236, the lower hinge arm cover 237, and the inner frame 220 can be accommodated in the space of the hinge housing 210.

The hinge arm 230 may include the plurality of rotation units 235*a* and 235*b* that are bent to have an arc corresponding to the space of the hinge housing 210. The plurality of rotation units 235*a* and 235*b* may include the plurality of first rotation units 235*a* provided in the first hinge arm 230*a* and the plurality of second rotation units 235*b* provided in the second hinge arm 230*b*.

The plurality of first rotation units 235*a* and the plurality of second rotation units 235*b* may be alternately disposed, and respective ends thereof may be disposed to overlap each other.

The plurality of first rotation units 235*a* and the plurality of second rotation units 235*b* may form a predetermined arc around each of a pair of rotation axes A. Accordingly, as the plurality of first rotation units 235*a* and the plurality of second rotation units 235*b* rotate about the pair of rotation axes A during a folding operation or an unfolding operation of the foldable display device 100, the first hinge arm 230*a* and the second hinge arm 230*b* may rotate together therewith.

Below the plurality of first rotation units 235*a* and the plurality of second rotation units 235*b*, a plurality of leaf springs 250 may be disposed to be in close contact with each of the plurality of first rotation units 235*a* and the plurality of second rotation units 235*b*. In this case, the leaf spring 250 is a component to implement a free stop function.

The plurality of leaf springs 250 may be disposed below the plurality of first rotation units 235*a* and the plurality of second rotation units 235*b* between the hinge arm 230 and the lower hinge arm cover 237.

Meanwhile, a distance between a first center that is a rotation center of the first virtual axis gear 241*a* and a second center that is a rotation center of the second virtual axis gear 241*d* may be formed to be greater than a distance between a third rotation center that is a rotation center of the first rotation gear 241*b* and a fourth rotation center that is a rotation center of the second rotation gear 241*c*.

A pair of virtual axes that pass through the first center of the first virtual axis gear 241*a* and the second center of the second virtual axis gear 241*d* may serve as central axes to which components constituting the hinge housing 210 are coupled. The virtual axes may be provided as a pair of virtual axes and respectively correspond to the first cover 110 and the second cover 120.

An axial height H may exist between a folded portion in which the first hinge arm 230*a* and the second hinge arm 230*b* are in contact with the display panel 180, and the rotation axis A. Also, a distance D between the pair of rotation axes A may be smaller than a sum of radii from the rotation axis A to the first rotation unit 235*a* and the second rotation unit 235*b*. However, the present disclosure is not limited thereto.

A rotation center of the first rotation unit 235*a* does not coincide with the first center that is the rotation center of the first virtual axis gear 241*a*, and a rotation center of the second rotation unit 235*b* does not coincide with the second center that is the rotation center of the second virtual axis gear 241*d*.

As described above, the present disclosure is characterized by having the link slider structure as well as the 4-axis sync gear 241 for sync between axes during 2-axis rotation. This will be described in detail with reference to FIGS. 7 to 9.

Figure 7:
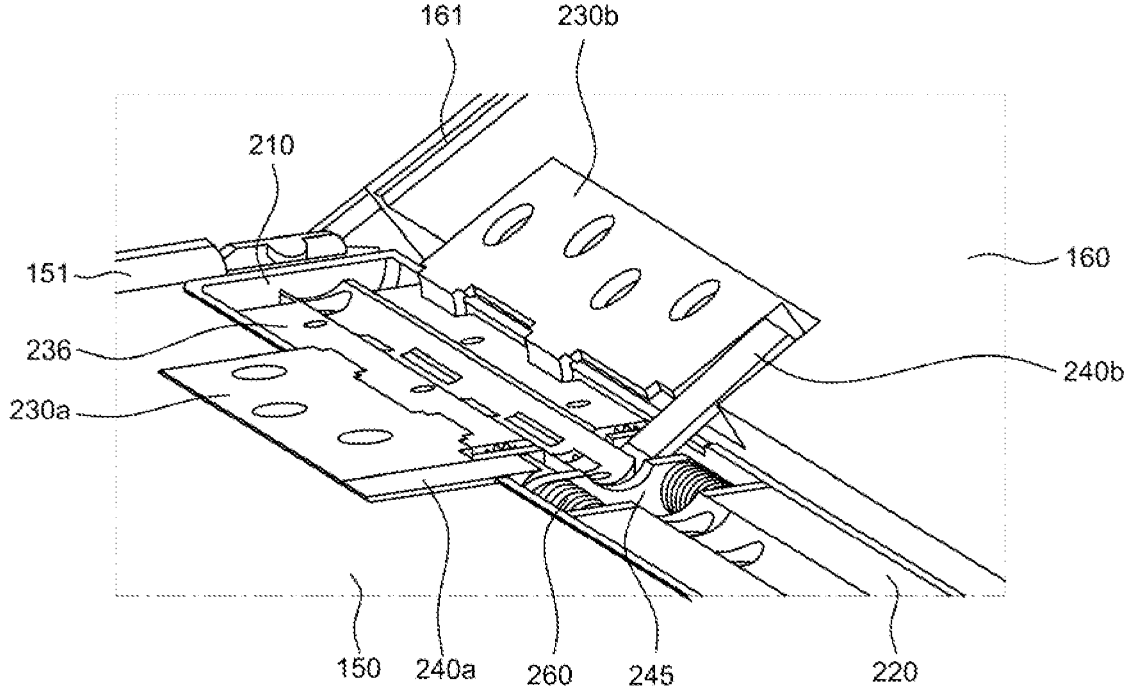
FIG. 7 is a perspective view illustrating a folding state at a specific angle of the foldable display device according to the first aspect of the present disclosure shown in FIG. 3.

FIG. 7 is a perspective view illustrating a folding state at a specific angle of the foldable display device according to the first exemplary aspect of the present disclosure shown in FIG. 3.

Figure 8:
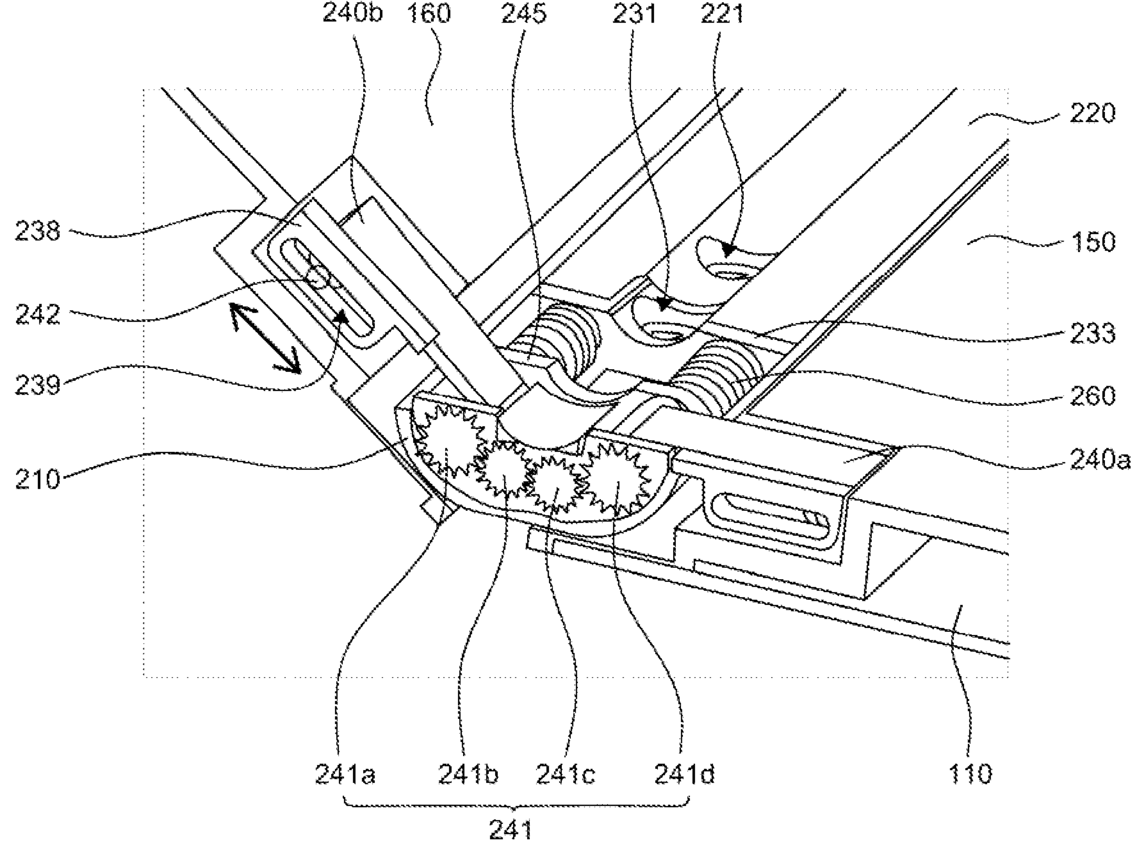
FIG. 8 is a cut-away perspective view illustrating a folding state at a specific angle of the foldable display device according to the first aspect of the present disclosure shown in FIG. 3.

FIG. 8 is a cut-away perspective view illustrating a folding state at a specific angle of the foldable display device according to the first exemplary aspect of the present disclosure shown in FIG. 3.

Figure 9:
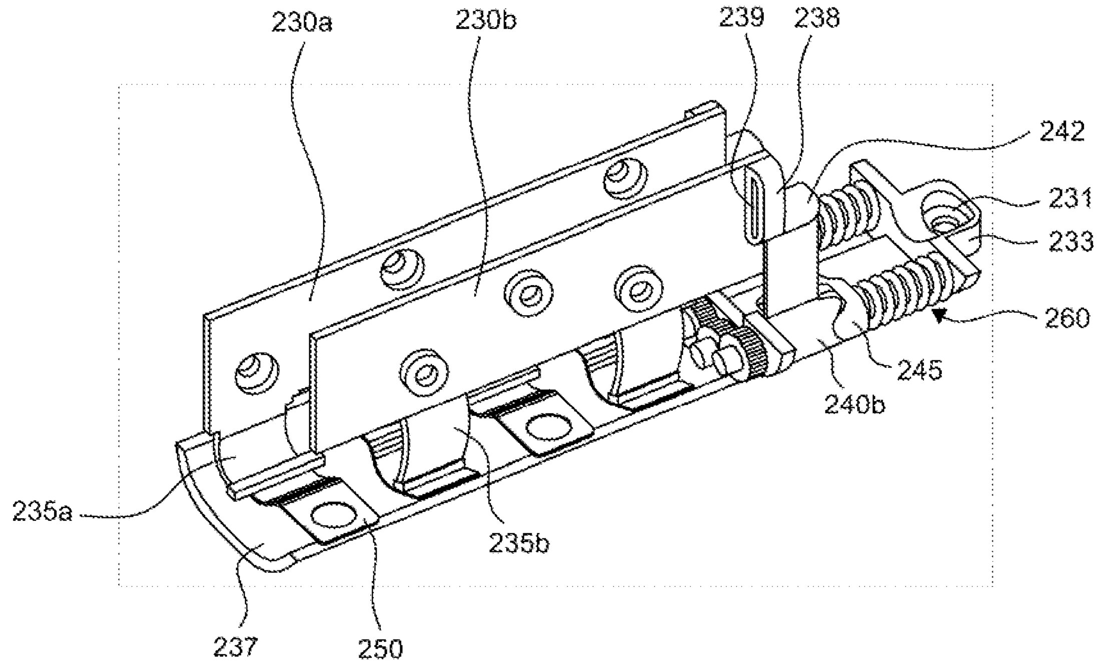
FIG. 9 is a perspective view illustrating a part of a configuration of the hinge assembly according to the first aspect of the present disclosure when folded.

FIG. 9 is a perspective view illustrating a part of a configuration of the hinge assembly according to the first exemplary aspect of the present disclosure when folded.

Figure 10:
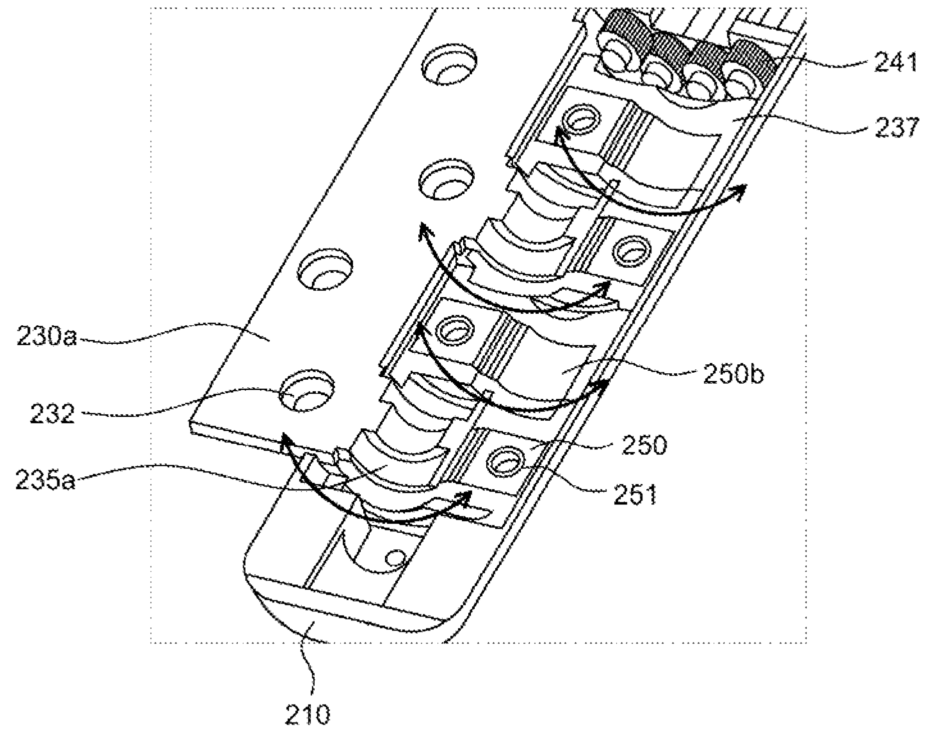
FIG. 10 is a perspective view illustrating a part of a configuration of the hinge assembly according to the first aspect of the present disclosure.

FIG. 10 is a perspective view illustrating a part of a configuration of the hinge assembly according to the first exemplary aspect of the present disclosure.

FIGS. 7 and 8 illustrate a specific folding state of the foldable display device in which the display panel and the bezel covers are omitted for convenience of explanation.

FIG. 8 is a perspective view illustrating a cross-section taken along the sync gear 241 in the foldable display device of FIG. 7 as an example.

FIG. 10 illustrates a part of a configuration of the hinge assembly including the first hinge arm 230*a* and the hinge housing 210 in a state in which the second hinge arm is removed for convenience of explanation.

Referring to FIGS. 7 to 10, the set housing 110 may be disposed under the hinge assembly and the set frames 150, 151, 160, and 161.

As described above, the set frames 150, 151, 160, and 161 include the first support plate 150 on the left and the second support plate 160 on the right, and the first frame 151 on the left and the second frame 161 on the right, but the present disclosure is not limited thereto.

The first support plate 150 and the second support plate 160 may be separately provided to be folded independently of each other, and the hinge assembly may be provided therebetween.

The foldable display device according to the first exemplary aspect of the present disclosure may be implemented in an inner folding manner in which a screen unit is disposed internally, when folded.

In addition, the first support plate 150 and the second support plate 160 according to the first exemplary aspect of the present disclosure may be disposed in one area and the other area where the foldable display device 100 is folded and unfolded.

The hinge assembly may include the hinge housing 210, the first and second hinge arms 230*a* and 230*b*, and the inner frame 220.

In addition, the hinge assembly according to the first exemplary aspect of the present disclosure may further include the upper hinge arm cover 236 and the lower hinge arm cover that are fastened at the upper and lower portions of the first and second hinge arms 230*a* and 230*b*.

The hinge assembly may include a pair of hinge arms, and the hinge arms may include the first hinge arm 230*a* and the second hinge arm 230*b* that are symmetrical to each other.

The first hinge arm 230*a* and the second hinge arm 230*b* according to the first exemplary aspect of the present disclosure are characterized by having a 2-axis folding (rotational) structure.

In addition, the first exemplary aspect of the present disclosure is characterized by having the 4-axis sync gear 241 and the link slider structure for sync between axes during 2-axis rotation.

Specifically, the sync gear 241 may include the first virtual axis gear 241*a* coupled to the first hinge arm 230*a* and the second virtual axis gear 241*d* coupled to the second hinge arm 230*b*.

In addition, the sync gear 241 may further include the first rotation gear 241*b* and the second rotation gear 241*c*.

The first rotation gear 241*b* and the second rotation gear 241*c* may be disposed to mesh with each other between the first virtual axis gear 241*a* and the second virtual axis gear 241*d*. That is, the first rotation gear 241*b* and the second rotation gear 241*c* and the first virtual axis gear 241*a* and the second virtual axis gear 241*d* may interlock with each other.

One side of the first virtual axis gear 241*a* and one side of the second virtual axis gear 241*d* are respectively rotatably fastened to the cam frame 233, while the other side of the first virtual axis gear 241*a* and the other side of the second virtual axis gear 241*d* may be rotatably fastened to the first hinge arm 230*a* and the second hinge arm 230*b* via the first gear arm 240*a* and the second gear arm 240*b*, respectively.

The first gear arm 240*a* and the second gear arm 240*b* may be connected to interlock with the first virtual axis gear 241*a* and the second virtual axis gear 241*d*, respectively. The first gear arm 240*a* and the second gear arm 240*b* may also be connected to the first hinge arm 230*a* and the second hinge arm 230*b*. Accordingly, during a folding operation or an unfolding operation of the foldable display device, according to rotation of the first gear arm 240*a* and the second gear arm 240*b* connected to the first hinge arm 230*a* and the second hinge arm 230*b*, respectively, the first virtual axis gear 241*a* and the second virtual axis gear 241*d* may rotate together therewith about a rotation axis.

At this time, the present disclosure includes the 4-axis sync gear for sync between axes during 2-axis rotation and is characterized in that the first gear arm 240*a* and the second gear arm 240*b* are slidably fastened to the first hinge arm 230*a* and the second hinge arm 230*b*, respectively.

That is, at ends of the first gear arm 240*a* and the second gear arm 240*b*, sliding pins 242 protruding toward the first hinge arm 230*a* and the second hinge arm 230*b* are respectively provided. And, sliding spaces 239 in which the sliding pins 242 are movable upwardly and downwardly may be provided in the first hinge arm 230*a* and the second hinge arm 230*b* that face the first gear arm 240*a* and the second gear arm 240*b*. Accordingly, during a folding operation or an unfolding operation of the foldable display device, the sliding pins 242 move upwardly and downwardly in the sliding spaces 239, and the first gear arm 240*a* and the second gear arm 240*b* can rotate in conjunction with rotation of the first hinge arm 230*a* and the second hinge arm 230*b*. As described above, a 2-axis hinge operation can be synchronized through the 4-axis sync gear 241 and the link slider structure.

In this case, the sliding spaces 239 may be provided in side protrusions 238 of the first hinge arm 230*a* and the second hinge arm 230*b*, but are not limited thereto.

Meanwhile, the present disclosure is characterized by implementing holding force using frictional force between components constituting the hinge in order to maintain a specific folding angle of the foldable display device during a folding operation and an unfolding operation of the foldable display device.

That is, the present disclosure is characterized by implementing torque by friction between the plurality of leaf springs 250 and the hinge arms, for example, the plurality of first rotation units 235*a* of the first hinge arm 230*a* or the plurality of second rotation units 235*a* of the second hinge arm 230*b*.

The leaf springs 250 may have elasticity.

The plurality of leaf springs 250 may be disposed below the plurality of first rotation units 235*a* or the plurality of second rotation units 235*b* between the first and second hinge arms 230*a* and 230*b* and the lower hinge arm cover 237, and impart frictional force to the rotation axis.

In this case, the leaf springs 250 may include friction units 250*b* that are disposed below the plurality of first rotation units 235*a* or the plurality of second rotation units 235*b* and provide frictional force.

The leaf springs 250 may be fastened to the lower hinge arm cover 237 through fastening holes 251 provided in the other sides of the friction unit 250*b*.

The hinge assembly according to the present disclosure may be disposed at a portion where the foldable display device is folded and unfolded to thereby facilitate a folding operation and an unfolding operation of the foldable display device. Also, the hinge assembly according to the present disclosure may provide holding force to maintain the foldable display device in a folded state at a specific angle.

As described above, the display panel may be disposed on one surface of the first support plate 150 and the second support plate 160. As the display panel, one of various display panels such as an organic light emitting display panel or a liquid crystal display panel may be used. Also, the display panel may have flexibility so that it can be folded and unfolded together with folding and unfolding of the foldable display device.

The foldable display may be folded such that the first support plate 150 and the second support plate 160 form a specific folding angle. That is, although the first support plate 150 and the second support plate 160 are fully unfolded to have an angle of, for example, 180° in FIG. 3, the foldable display device may be folded at a specific angle. That is, in FIGS. 7 and 8, the first support plate 150 and the second support plate 160 are shown in a folded state to have an angle between, for example, 90° to 180°, but the present disclosure is not limited thereto. In this case, the display panel disposed on the first support plate 150 and the second support plate 160 may also be folded together with folding of the first support plate 150 and the second support plate 160.

The foldable display device may be folded at a specific angle according to a user's intention. Also, the foldable display device may be completely folded or unfolded according to a user's intention. The foldable display device is capable of inner folding (or in-folding) to be folded or unfolded so that the display panel is disposed on an inside thereof, and is capable of out-folding to be folded or unfolded so that the display panel is disposed on an outside thereof.

The foldable display device may maintain a specific folding angle by the holding force provided from the hinge assembly. In other words, the first support plate 150 and the second support plate 160 may be fixed in a state in which they maintain a specific folding angle by the hinge assembly. Accordingly, the foldable display device may be folded at a specific angle according to a user's intention, and may maintain a folded state at a specific angle by the holding force of the hinge assembly.

In particular, the present disclosure is characterized in that a specific folding angle of the foldable display device can be maintained by implementing holding torque and a free stop function through applying a structure of the cam 245 including the compression spring 260, and the holding torque can be strengthened by assisting the free stop function through applying the leaf spring 250. This will be described in detail with reference to FIG. 11.

Figure 11:
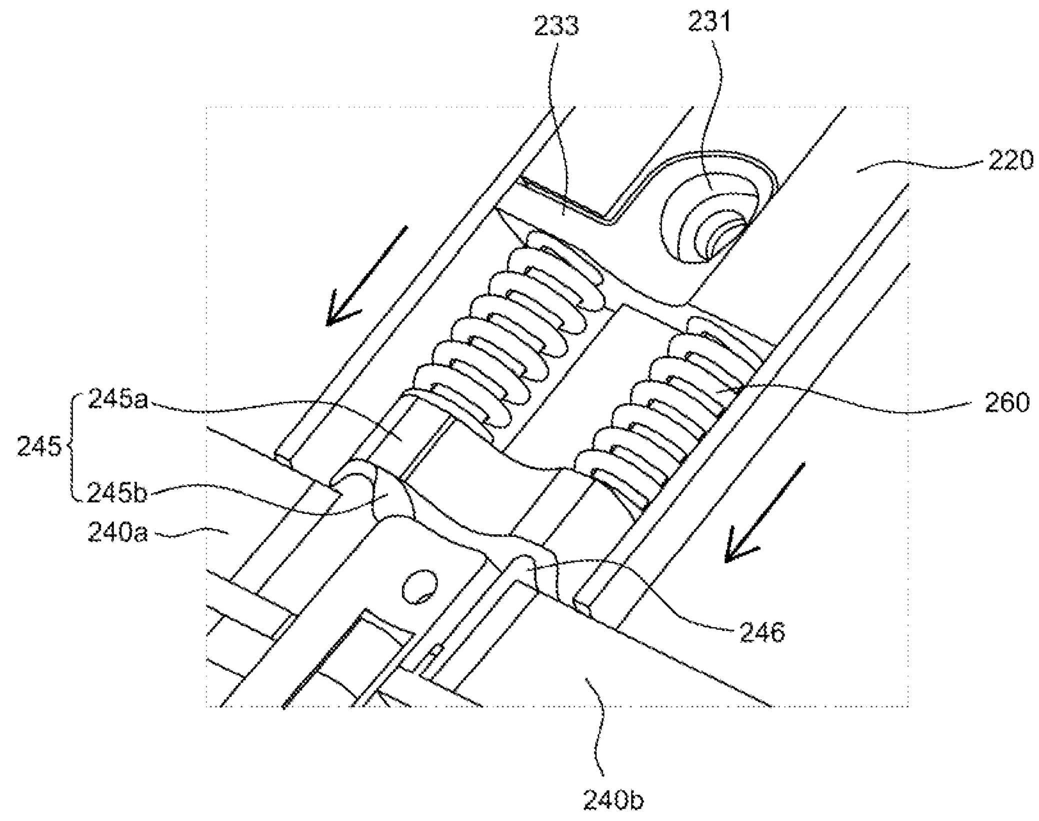
FIG. 11 is a perspective view illustrating a part of a configuration of the hinge assembly according to the first aspect of the present disclosure.

FIG. 11 is a perspective view illustrating a part of a configuration of the hinge assembly according to the first exemplary aspect of the present disclosure.

FIG. 11 shows, as an example, a part of a configuration of the hinge assembly including the compression spring 260 and the cam 245.

Referring to FIG. 11, in the present disclosure, torque may be implemented by a cam structure of the first gear arm 240*a* and the second gear arm 240*b* and the cam 245 and the compression force of the compression spring 260.

That is, the holding torque and the free stop function can be implemented by applying the compression spring 260 and the cam structure during an open or close rotation.

In addition, the present disclosure is characterized in that the leaf spring 250 is applied in addition to the cam structure to assist the free stop function (refer to FIG. 10 together).

Specifically, the hinge assembly of the present disclosure may include a pair of cam structures functioning as a free stop hinge, for example, may be formed of a first cam structure of the cam 245 and a second cam structure of the first gear arm 240*a* and the second gear arm 240*b*.

The free stop hinge means a hinge device that does not provide stopping force at 180 degrees during opening and closing operations of the foldable display device, and means that the foldable display device does not receive stopping force from the hinge device except for 0 degrees and 360 degrees.

The first and second cam structures may be configured as rotating cams. However, the present disclosure is not limited thereto, and one cam structure among the first and second cam structures may be configured as a rotating cam, and the other cam structure may be configured as a sliding cam. The first cam structure and the second cam structure may support a stop state of the foldable display device while performing a cam operation with cam surfaces face each other. The cam operation provides force for the compression springs 260 to be in close contact with each other and is possible through the cam operation of rotation and/or sliding of the first cam structure and the second cam structure.

The cam 245 of the first cam structure employed in the hinge assembly according to the first exemplary aspect of the present disclosure includes a body 245*a* and a first detent 245*b* provided on one surface of the body 245*a*, and the second cam structure may include a second detent 246 provided on one surface of the first gear arm 240*a* and the second gear arm 240*b*.

At a center of the body 245*a* of the cam 245, a first hinge hole for inserting the first virtual axis gear 241*a* and the second virtual axis gear 241*d* may be formed in an axial direction of the first virtual axis gear 241*a* and the second virtual axis gear 241*d*.

In addition, at a center of the first gear arm 240*a* and the second gear arm 240*b*, a second hinge hole for inserting the first virtual axis gear 241*a* and the second virtual axis gear 241*d* may be formed in the axial direction of the first virtual axis gear 241*a* and the second virtual axis gear 241*d*.

The first detent 245*b* may have a protruding shape in a mountain shape, and may protrude from the body 245*a* in a direction of the first gear arm 240*a* and the second gear arm 240*b*. The second detent 246 may have a protruding shape in a mountain shape, and may protrude from the first gear arm 240*a* and the second gear arm 240*b* toward the cam 245. The mountain shape means that a surface has an ascending sloped sliding face, a descending sloped sliding face and a flat sliding face. However, the present disclosure is not limited thereto.

A plurality of first detents 245*b* may be provided at predetermined intervals with respect to the first hinge hole. A plurality of second detents 246 may be provided at predetermined intervals with respect to the second hinge hole. The plurality of first detents 245*b* and the plurality of second detents 246 may be disposed at positions facing each other.

Meanwhile, the cam structures of the present disclosure may allow for an increase in the number of the first cam structure in order to increase torque, which will be described in detail through the following second exemplary aspect of the present disclosure.

Figure 12:
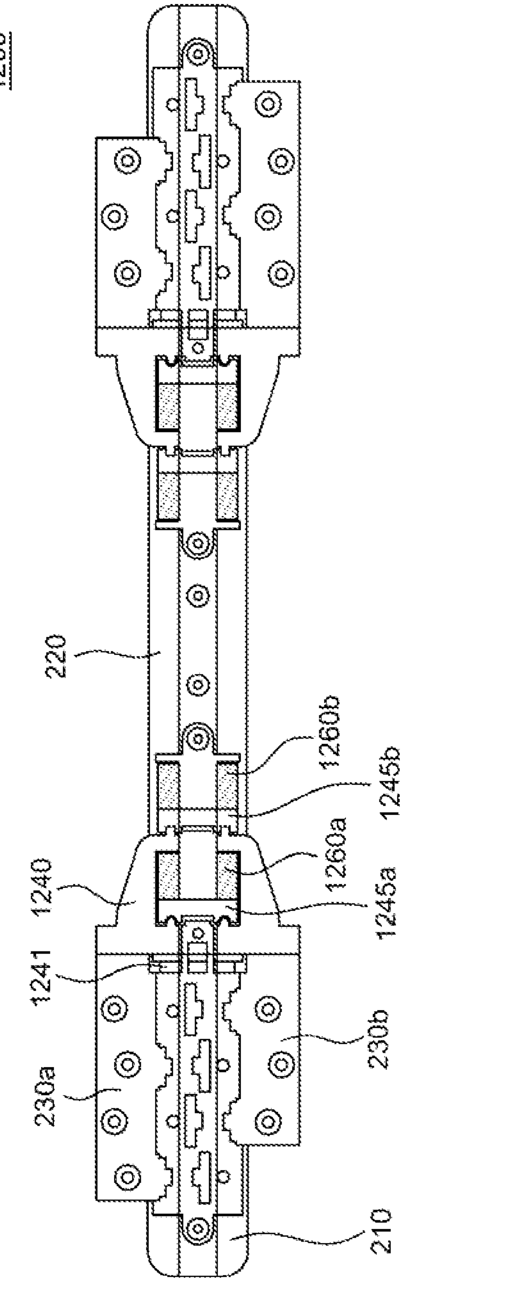
FIG. 12 is a plan view of a hinge assembly according to a second aspect of the present disclosure.

FIG. 12 is a plan view of a hinge assembly according to a second exemplary aspect of the present disclosure.

Figure 13:
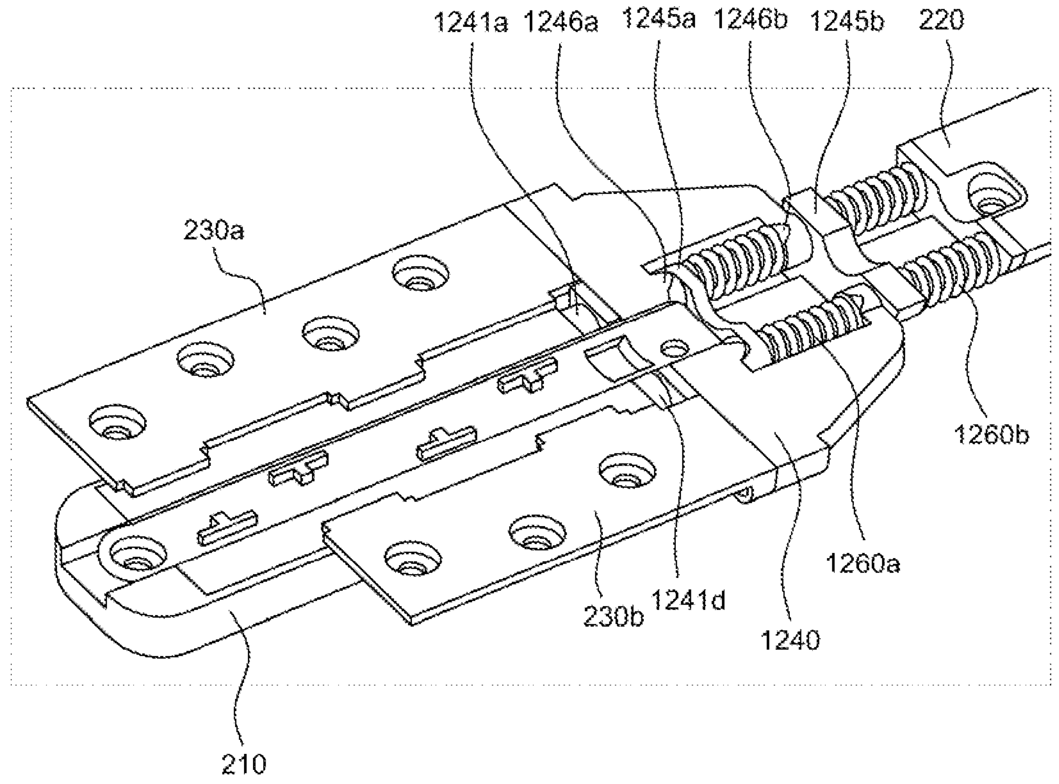
FIG. 13 is a perspective view illustrating a part of a configuration of the hinge assembly according to the second aspect of the present disclosure shown in FIG. 12.

FIG. 13 is a perspective view illustrating a part of a configuration of the hinge assembly according to the second exemplary aspect of the present disclosure shown in FIG. 12.

Since a hinge assembly 1200 according to the second exemplary aspect of the present disclosure shown in FIGS. 12 and 13 differs from that of the first exemplary aspect described above only in terms of including two cams 1245*a* and 1245*b* and two compression springs 1260*a* and 1260*b*, and other configurations thereof are substantially the same, a redundant description thereof will be omitted. The same reference numerals are used for the same components.

Referring to FIGS. 12 and 13, the hinge assembly 1200 according to the second exemplary aspect of the present disclosure may be largely configured to include the hinge housing 210, the first and second hinge arms 230*a* and 230*b*, and the inner frame 220.

The hinge assembly 1200 includes a pair of hinge arms on respective both sides thereof, that is, the first and second hinge arms 230*a* and 230*b*, and the first and second hinge arms 230*a* and 230*b* may be rotatably connected to each other, but the present disclosure is not limited thereto.

The first and second hinge arms 230*a* and 230*b* according to the second exemplary aspect of the present disclosure are characterized by having a 2-axis folding (rotational) structure.

In addition, the present disclosure is characterized by having a link slider structure of a gear arm 1240 and a 4-axis sync gear 1241 for sync between axes during 2-axis rotation.

The sync gear 1241 may include a first virtual axis gear 1241*a* coupled to the first hinge arm 230*a* and a second virtual axis gear 1241*d* coupled to the second hinge arm 230*b*.

In addition, the sync gear 1241 may further include a first rotation gear and a second rotation gear, and the first virtual axis gear 1241*a* and the second virtual axis gear 1241*d* may mesh with the first rotation gear and the second rotation gear, respectively.

The gear arm 1240 may be a link configuration for connecting the first virtual axis gear 1241*a* and the second virtual axis gear 1241*d* and the first hinge arm 230*a* and the second hinge arm 230*b*.

The first compression spring 1260*a* for implementing frictional force of the first cam 1245*a* may be provided in the gear arm 1240. The first compression spring 1260*a* may be disposed in the gear arm 1240 between the first cam 1245*a* and the second cam 1245*b*, but is not limited thereto.

The first compression spring 1260*a* may be provided on outer surfaces of the first virtual axis gear 1241*a* and the second virtual axis gear 1241*d* between the first cam 1245*a* and the second cam 1245*b*.

Between the first compression spring 1260*a* and the first and second hinge arms 230*a* and 230*b*, the first cam 1245*a* for maintaining folding and unfolding angles of the first and second hinge arms 230*a* and 230*b* may be disposed.

The second compression spring 1260*b* for implementing frictional force of the second cam 1245*b* may be provided between the first compression spring 1260*a* and the inner frame 220.

The second compression spring 1260*b* may be provided on outer surfaces of the first virtual axis gear 1241*a* and the second virtual axis gear 1241*d* between the second cam 1245*b* and the inner frame 220.

The second cam 1245*b* for maintaining folding and unfolding angles of the first and second hinge arms 230*a* and 230*b* may be provided between the second compression spring 1260*b* and the gear arm 1240.

A cam structure similar to the cam structure described above may be provided on each of the gear arm 1240, the first cam 1245*a*, and the second cam 1245*b*, and second upper and lower detents 1246*a* and 1246*b* may be respectively provided on an upper end and a lower end of the gear arm 1240. In addition, a first upper detent may be provided on the first cam 1245*a* corresponding to the second upper detent 1246*a*, and a first lower detent may be provided on the second cam 1245*b* corresponding to the second lower detent 1246*b*.

As described above, in the case of the second exemplary aspect of the present disclosure, the holding torque can be increased compared to the first exemplary aspect described above by providing the two cams 1245*a* and 1245*b* and the two compression springs 1260*a* and 1260*b*.

Meanwhile, when a free stop and holding torque are implemented, dust is generated due to friction between parts, which may cause operation failure. However, the foldable display device of the present disclosure is characterized by applying a dust discharge structure to the leaf spring 250 and the upper hinge arm cover 236. This will be described in detail with reference to FIGS. 14A, 14B and 15.

Figure 14A:
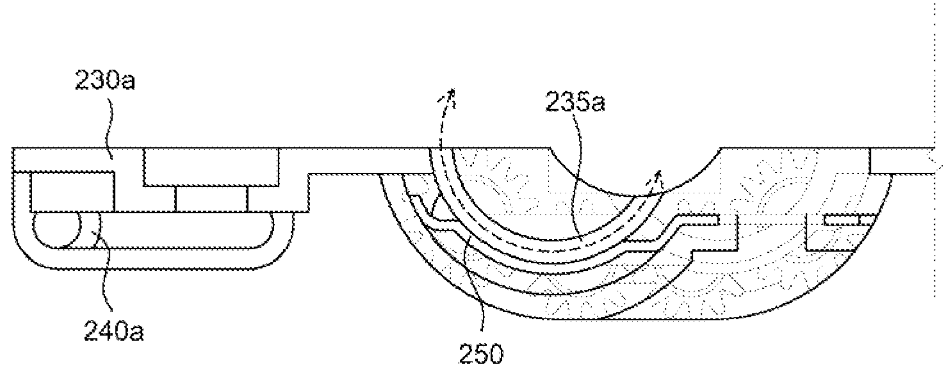
FIG. 14A is a cross-sectional view illustrating a part of the hinge assembly according to the first aspect of the present disclosure.

FIG. 14A is a cross-sectional view illustrating a part of the hinge assembly according to the first exemplary aspect of the present disclosure.

Figure 14B:
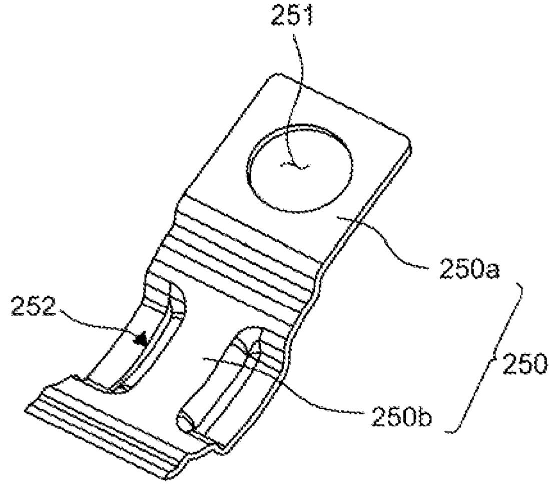
FIG. 14B is a perspective view illustrating a leaf spring shown in FIG. 14A.

FIG. 14B is a perspective view illustrating a leaf spring shown in FIG. 14A.

Figure 15:
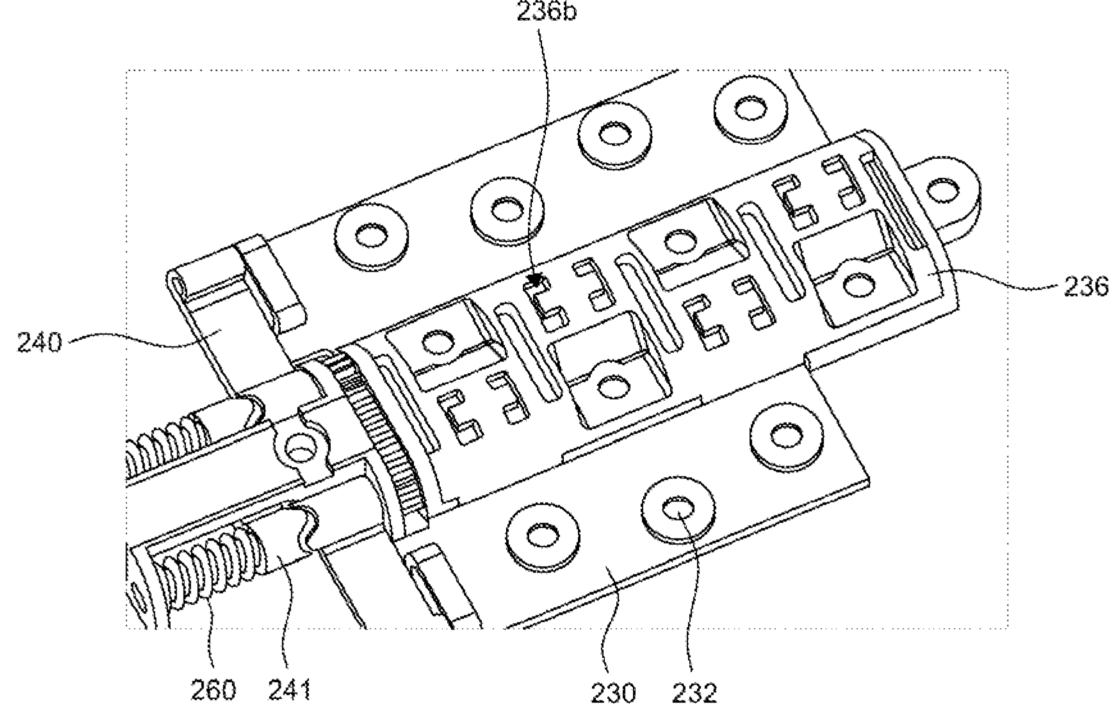
FIG. 15 is a perspective view illustrating a part of the hinge assembly according to the first aspect of the present disclosure as an example.

FIG. 15 is a perspective view illustrating a part of the hinge assembly according to the first exemplary aspect of the present disclosure as an example.

FIG. 14A illustrates only a part of a left side configuration of the hinge assembly as an example for convenience of explanation.

Referring to FIGS. 14A and 14B, each of the leaf springs 250 of the present disclosure may be disposed below the first rotation unit 235*a* in close contact with the first rotation unit 235*a*, or disposed below the second rotation unit in close contact with the second rotation unit.

The leaf springs 250 may have elasticity. In addition, the leaf spring 250 may include a body 250*a* having the fastening hole 251 and the friction unit 250*b* extending from the body 250*a* and disposed below the first rotation unit 235*a* or the second rotation unit to thereby provide frictional force.

The leaf spring 250 may be fastened to the lower hinge arm cover through the fastening hole 251.

In both sides of the friction unit 250*b* of the leaf spring 250, discharge passages 252 that are recessed downwardly are provided, so that dust generated by friction can be easily discharged to sides of the friction unit 250*b* of the leaf spring 250.

Also, referring to FIG. 15, the upper hinge arm cover 236 has a plurality of through holes 236*b* in an area where dust is intensively accumulated, so that dust can be easily discharged through the through holes 236*b*.

Accordingly, it is possible to improve operation failure of the foldable display device due to dust.

The through holes 236*b* may have various shapes and may be formed to have a constant path.

Meanwhile, in the present disclosure, a shutter frame may be applied to support and bend the display panel, which will be described in detail through a third exemplary aspect of the present disclosure.

Figure 16:
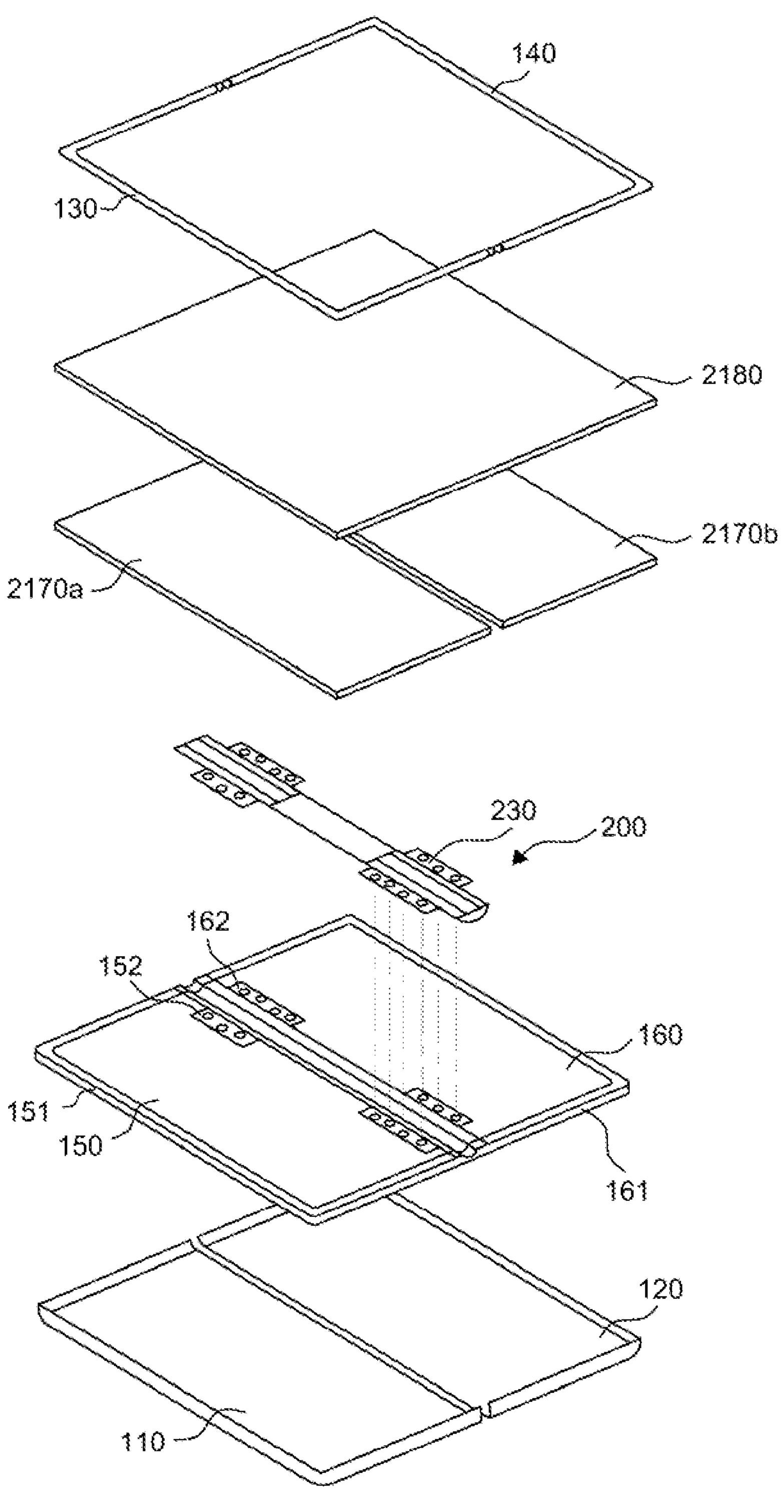
FIG. 16 is a schematic exploded perspective view of a foldable display device according to a third aspect of the present disclosure.

FIG. 16 is a schematic exploded perspective view of a foldable display device according to the third exemplary aspect of the present disclosure.

Figure 17A:
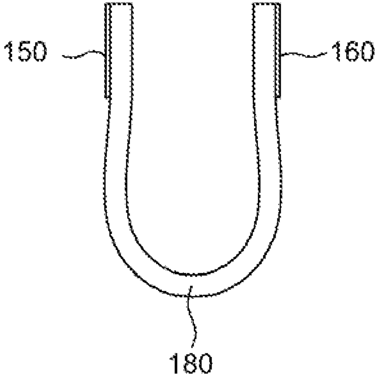
FIGS. 17A and 17B are schematic cross-sectional views of the foldable display devices according to the first and third aspects of the present disclosure.
Figure 17B:
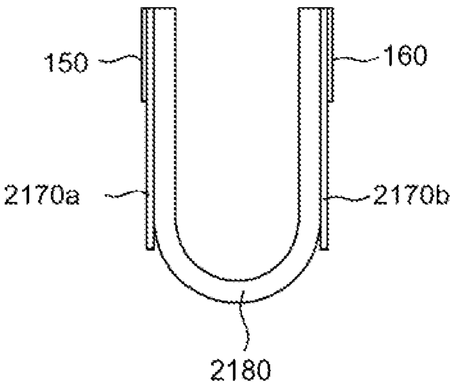

FIGS. 17A and 17B are schematic cross-sectional views of foldable display devices according to first and third exemplary aspects of the present disclosure.

Figure 18A:
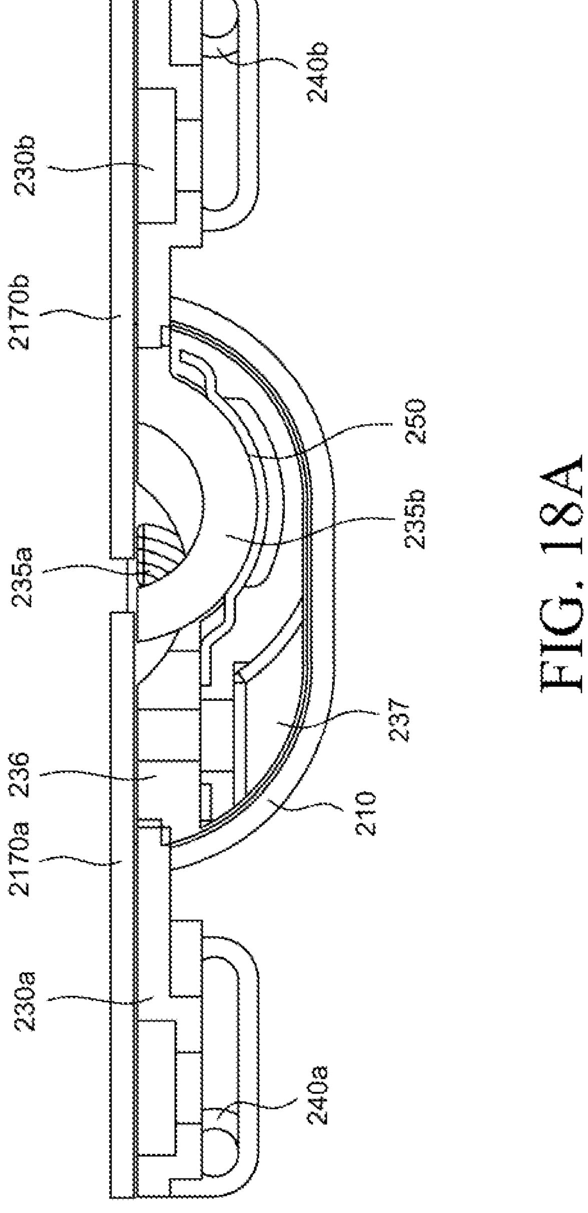
FIG. 18A is a cross-sectional view illustrating a part of a configuration of a hinge assembly according to the third aspect of the present disclosure.

FIG. 18A is a cross-sectional view illustrating a part of a configuration of a hinge assembly according to a third exemplary aspect of the present disclosure.

Figure 18B:
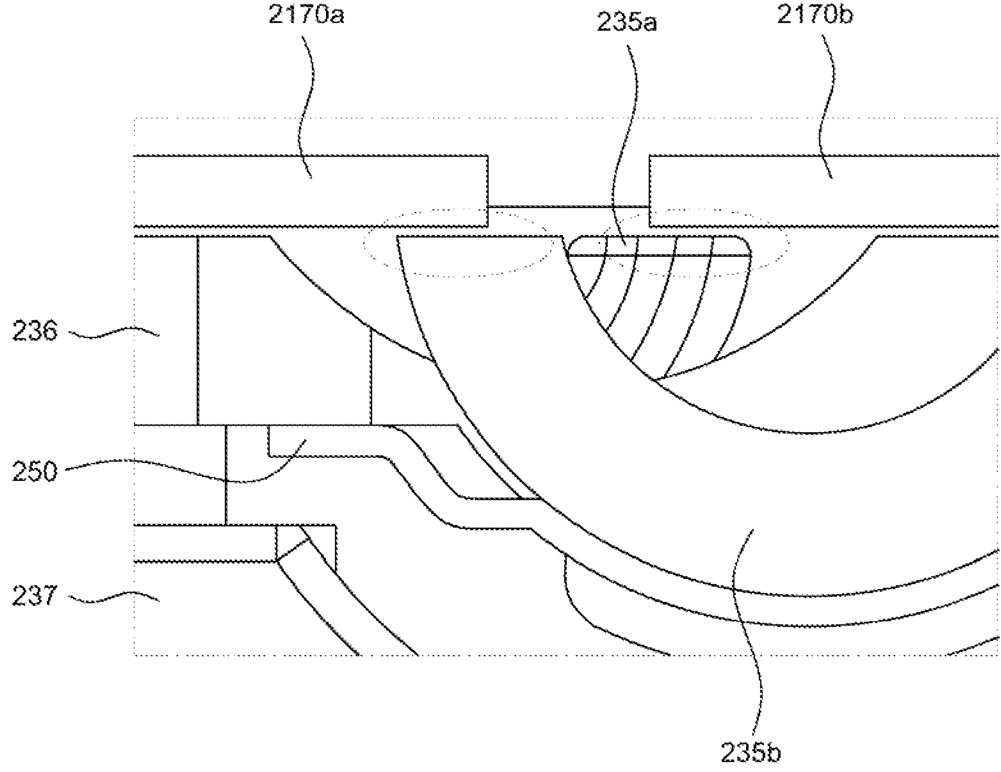
FIG. 18B is an enlarged view of a part of FIG. 18A.

FIG. 18B is an enlarged view of a part of FIG. 18A.

Since the foldable display device according to the third exemplary aspect of the present disclosure of FIG. 16 to FIGS. 18A and 18B differs from those of the first and second exemplary aspects only in terms of shutter frames 2170*a* and 2170*b* below a display panel 2180, and other configurations thereof are substantially the same, a redundant description thereof will be omitted. The same reference numerals are used for the same components.

Referring to FIG. 16 to FIGS. 18A and 18B, the foldable display device according to the third exemplary aspect of the present disclosure may be configured to include the set housings 110 and 120, the set frames 150, 151, 160, 161, and the hinge assembly 200, the display panel 2180, the shutter frames 2170*a* and 2170*b*, and the bezel covers 130 and 140.

The third exemplary aspect of the present disclosure is characterized in that the shutter frames 2170*a* and 2170*b* are disposed between the display panel 2180 and the set frames 150, 151, 160 and 161.

The shutter frames 2170*a* and 2170*b* may include a first shutter frame 2170*a* on the left and a second shutter frame 2170*b* on the right, but the present disclosure is not limited thereto.

The first shutter frame 2170*a* and the second shutter frame 2170*b* may be provided to have the same shape.

In this case, the shutter frames 2170*a* and 2170*b* may have the same shape as the display panel 2180 except for an area thereof where the hinge assembly 200 is disposed. The shutter frames 2170*a* and 2170*b* may compensate for a step due to a shape of the hinge assembly 200.

The shutter frames 2170*a* and 2170*b* may be formed of a metallic material such as copper (Cu), aluminum (Al), and stainless use steel (SUS) having rigidity, and may have a heat dissipation function added thereto.

The shutter frames 2170*a* and 2170*b* may support a flat shape of the display panel 2180 when unfolded, and support a rear surface of the display panel 2180 and maintain a curvature thereof when folded.

The shutter frames 2170*a* and 2170*b* maintain the curvature of the display panel 2180 when folded and thus, relieve stress. That is, in the case of the first exemplary aspect to which the shutter frames 2170*a* and 2170*b* are not applied, as shown in FIG. 17A, stress rises at an inflection point where the first support plate 150 and the second support plate 160 end, so that a curvature of "Ω" shape may be formed.

On the other hand, in the case of the third exemplary aspect to which the shutter frames 2170*a* and 2170*b* are applied, as shown in FIG. 17B, a curvature of "U"-shape is formed without an inflection point due to the support of the shutter frames 2170*a* and 2170*b*, so that a stable curvature without stress may be maintained.

In particular, as in FIGS. 18A and 18B, when the foldable display device is unfolded, the ends of the first rotation unit 235*a* of the first hinge arm 230*a* and the second rotation unit 235*b* of the second hinge arm 230*b* support the shutter frames 2170*a* and 2170*b*, whereby bending of the shutter frames 2170*a* and 2170*b* can be prevented and flatness thereof can be maintained.

That is, the ends of the shutter frames 2170*a* and 2170*b*, which are easily bent or deformed, are respectively supported by the first rotation unit 235*a* of the first hinge arm 230*a* and the second rotation unit 235*b* of the second hinge arm 230*b*, whereby bending of the shutter frames 2170*a* and 2170*b* can be prevented and flatness thereof can be maintained.

A predetermined interval is provided between the first shutter frame 2170*a* and the second shutter frame 2170*b*, and the end of the first shutter frame 2170*a* may be supported by the second rotation unit 235*b* of the second hinge arm 230*b* and the end of the second shutter frame 2170*b* may be supported by the first rotation unit 235*a* of the first hinge arm 230*a*.

The exemplary aspects of the present disclosure can also be described as follows:

According to an aspect of the present disclosure, there is provided a foldable display device. The foldable display device includes a first support plate and a second support plate, a display panel disposed on the first support plate and the second support plate and a hinge assembly disposed between the first support plate and the second support plate, wherein the hinge assembly includes, a first hinge arm and a second hinge arm rotatably connected to each other, a first virtual axis gear coupled to the first hinge arm, a second virtual axis gear coupled to the second hinge arm, a first rotational gear and a second rotational gear disposed to mesh with each other between the first virtual axis gear and the second virtual axis gear and a first gear arm and a second gear arm fastened to interlock with the first virtual axis gear and the second virtual axis gear, wherein the first support plate, the second support plate, and the display panel perform folding and unfolding operations about a rotation axis different from central axes of the first virtual axis gear and the second virtual axis gear.

The foldable display device may further include a first cover and a second cover disposed under the first support plate and the second support plate, a first bezel cover and a second bezel cover covering an edge of an upper surface of the display panel and a first frame and a second frame surrounding edges of the first bezel cover and the first support plate, and edges of the second bezel cover and the second support plate, respectively.

The hinge assembly may further include a hinge housing in which the first hinge arm and the second hinge arm are accommodated and an upper hinge arm cover and a lower hinge arm cover that are respectively fastened at upper and lower portions of the first hinge arm and the second hinge arm.

The first virtual axis gear and the second virtual axis gear may be spaced apart from each other without meshing with each other, wherein the first virtual axis gear and the second virtual axis gear, and the first rotation gear and the second rotation gear, may respectively maintain left and right synchronization.

The foldable display device may further include a cam frame to which one side of the first virtual axis gear and one side of the second virtual axis gear are rotatably coupled.

The other side of the first virtual axis gear and the other side of the second virtual axis gear may be rotatably fastened to the first hinge arm and the second hinge arm via the first gear arm and the second gear arm, respectively.

The foldable display device may further include compression springs provided on outer surfaces of the first virtual axis gear and the second virtual axis gear between the first gear arm and the second gear arm and the cam frame.

The foldable display device may further include a cam disposed between the first gear arm and the second gear arm and the compression spring to maintain folding and unfolding angles of the first hinge arm and the second hinge arm.

The cam may include a body and a first detent provided on one surface of the body, wherein the first gear arm and the second gear arm may include a second detent, one surface thereof.

In the body of the cam, a first hinge hole into which the first virtual axis gear and the second virtual axis gear are inserted may be formed in an axial direction of the first virtual axis gear and the second virtual axis gear, wherein in the first gear arm and the second gear arm, a second hinge hole into which the first virtual axis gear and the second virtual axis gear are inserted may be formed in the axial direction of the first virtual axis gear and the second virtual axis gear.

The first detent may protrude from the body in a direction of the first gear arm and the second gear arm, and the second detent may protrude from the first gear arm and the second gear arm in a direction of the cam.

The first detent may include a plurality of first detents that are provided at predetermined intervals with respect to the first hinge hole, and the second detent may include a plurality of second detents that are provided at predetermined intervals with respect to the second hinge hole, wherein the plurality of first detents and the plurality of second detents may be disposed at positions facing each other.

The first hinge arm and the second hinge arm may include a plurality of first rotation units and a plurality of second rotation units that are bent to have an arc corresponding to an inner space of the hinge housing, wherein the plurality of first rotation units and the plurality of second rotation units may be alternately disposed, and respective ends of the plurality of first rotation units and the plurality of second rotation are disposed to overlap each other.

Each of the plurality of first rotation units and the plurality of second rotation units may be bent to draw a predetermined arc about the rotation axis.

The foldable display device may further include a plurality of leaf springs that are disposed between the first hinge arm and the second hinge arm, and the lower hinge arm cover, and disposed below the plurality of first rotation units and the plurality of second rotation units to be in close contact with the plurality of first rotation units and the plurality of second rotation units.

The leaf springs may include friction units providing frictional force to the plurality of first rotation units or the plurality of second rotation units; fastening holes provided in the other sides of the friction units to fasten the leaf springs to the lower hinge arm cover.

The first gear arm and the second gear arm may be respectively connected to interlock with the first virtual axis gear and the second virtual axis gear, and the first gear arm and the second gear arm are connected to the first hinge arm and the second hinge arm.

The foldable display device may further include sliding pins protruding toward the first hinge arm and the second hinge arm at ends of the first gear arm and the second gear arm, respectively.

The sliding pins may slidably move along sliding spaces provided in the first hinge arm and the second hinge arm that face the first gear arm and the second gear arm during the folding operation and the unfolding operation.

The foldable display device may further include a first shutter frame and a second shutter frame disposed under the display panel, wherein the first shutter frame and the second shutter frame may be spaced apart from each other and overlap the hinge assembly, wherein an end of the first shutter frame overlapping the hinge assembly may be supported by the second rotation unit of the second hinge arm, and an end of the second shutter frame overlapping the hinge assembly may be supported by the first rotation unit of the first hinge arm.

The leaf spring may have a dust discharge passage provided on at least one side of the friction unit.

The upper hinge arm cover may have a plurality of through holes for discharging dust.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:

a first support plate and a second support plate;

a display panel disposed on the first support plate and the second support plate;

a hinge assembly disposed between the first support plate and the second support plate, wherein the hinge assembly includes:

a first hinge arm and a second hinge arm rotatably connected to each other;

a first virtual axis gear coupled to the first hinge arm;

a second virtual axis gear coupled to the second hinge arm;

a first rotational gear and a second rotational gear disposed to mesh with each other between the first virtual axis gear and the second virtual axis gear;

a first gear arm and a second gear arm fastened to interlock with the first virtual axis gear and the second virtual axis gear;

a cam frame to which one side of the first virtual axis gear and one side of the second virtual axis gear are rotatably coupled; and an inner frame that provides a through groove to which the cam frame is attached to fix an inside of the hinge assembly;

a hinge housing disposed below the hinge assembly, the hinge housing including an internal space that receives the inner frame and a fastening member that fixes the inner frame by engaging with the through groove;

a first compression spring provided on outer surfaces of the first virtual axis gear and the second virtual axis gear between a first cam and a second cam; and a second compression spring provided on outer surfaces of the first virtual axis gear and the second virtual axis gear between the second cam and the inner frame, wherein the first virtual axis gear meshes with the first rotational gear, and the second virtual axis gear meshes with the second rotational gear, and wherein the first support plate, the second support plate, and the display panel perform folding and unfolding operations about a rotation axis different from central axes of the first virtual axis gear and the second virtual axis gear.

2. The foldable display device of claim 1, further comprising:

a first cover and a second cover disposed under the first support plate and the second support plate;

a first bezel cover and a second bezel cover covering an edge of an upper surface of the display panel; and a first frame and a second frame surrounding edges of the first bezel cover and the first support plate, and edges of the second bezel cover and the second support plate, respectively.

3. The foldable display device of claim 1, wherein the hinge assembly further includes:

a hinge housing in which the first hinge arm and the second hinge arm are accommodated; and an upper hinge arm cover and a lower hinge arm cover that are respectively fastened at upper and lower portions of the first hinge arm and the second hinge arm.

4. The foldable display device of claim 1, wherein the first virtual axis gear and the second virtual axis gear are spaced apart from each other, and wherein the first virtual axis gear and the second virtual axis gear, and the first rotation gear and the second rotation gear, respectively maintain left and right synchronization.

5. The foldable display device of claim 1, wherein the first virtual axis gear and the second virtual axis gear are rotatably fastened to the first hinge arm and the second hinge arm via the first gear arm and the second gear arm, respectively.

6. The foldable display device of claim 1, wherein the first cam includes a body and a first detent provided on one surface of the body, and wherein the first gear arm and the second gear arm include a second detent, one surface thereof.

7. The foldable display device of claim 6, wherein, in the body of the first cam, a first hinge hole into which the first virtual axis gear and the second virtual axis gear are inserted is formed in an axial direction of the first virtual axis gear and the second virtual axis gear, and wherein in the first gear arm and the second gear arm, a second hinge hole into which the first virtual axis gear and the second virtual axis gear are inserted is formed in the axial direction of the first virtual axis gear and the second virtual axis gear.

8. The foldable display device of claim 6, wherein the first detent protrudes from the body in a direction of the first gear arm and the second gear arm, and wherein the second detent protrudes from the first gear arm and the second gear arm in a direction of the first cam.

9. The foldable display device of claim 7, wherein the first detent includes a plurality of first detents that are provided at predetermined intervals with respect to the first hinge hole, and the second detent includes a plurality of second detents that are provided at predetermined intervals with respect to the second hinge hole, and wherein the plurality of first detents and the plurality of second detents are disposed at positions facing each other.

10. The foldable display device of claim 3, wherein the first hinge arm includes a plurality of first rotation units and the second hinge arm includes a plurality of second rotation units, the plurality of first rotation units and the plurality of second rotation units are bent to have an arc corresponding to an inner space of the hinge housing, and wherein the plurality of first rotation units and the plurality of second rotation units are alternately disposed, and respective ends of the plurality of first rotation units and the plurality of second rotation are disposed to overlap each other.

11. The foldable display device of claim 10, wherein each of the plurality of first rotation units and the plurality of second rotation units is bent to draw a predetermined arc about the rotation axis.

12. The foldable display device of claim 10, further comprising a plurality of leaf springs disposed between the first hinge arm and the second hinge arm, and the lower hinge arm cover, and disposed below the plurality of first rotation units and the plurality of second rotation units to be in close contact with the plurality of first rotation units and the plurality of second rotation units.

13. The foldable display device of claim 12, wherein the leaf springs include friction units providing frictional force to the plurality of first rotation units or the plurality of second rotation units, and fastening holes provided in the friction units to fasten the leaf springs to the lower hinge arm cover.

14. The foldable display device of claim 1, wherein the first gear arm and the second gear arm are respectively connected to interlock with the first virtual axis gear and the second virtual axis gear, and the first gear arm and the second gear arm are connected to the first hinge arm and the second hinge arm.

15. The foldable display device of claim 1, further comprising sliding pins protruding toward the first hinge arm and the second hinge arm at ends of the first gear arm and the second gear arm, respectively.

16. The foldable display device of claim 15, wherein the sliding pins slidably move along sliding spaces provided in the first hinge arm and the second hinge arm that face the first gear arm and the second gear arm during the folding operation and the unfolding operation.

17. The foldable display device of claim 3, further comprising a first shutter frame and a second shutter frame disposed under the display panel, wherein the first shutter frame and the second shutter frame are spaced apart from each other and overlap the hinge assembly, and wherein an end of the first shutter frame overlapping the hinge assembly is supported by the second rotation unit of the second hinge arm, and an end of the second shutter frame overlapping the hinge assembly is supported by the first rotation unit of the first hinge arm.

18. The foldable display device of claim 13, wherein the leaf spring has a dust discharge passage provided on at least one side of the friction unit.

19. The foldable display device of claim 3, wherein the upper hinge arm cover has a plurality of through holes for discharging dust.

* * * * *